United States Patent
Upadhyaya et al.

(10) Patent No.: US 8,715,789 B2
(45) Date of Patent: May 6, 2014

(54) CHEMICAL VAPOR DEPOSITION FOR AN INTERIOR OF A HOLLOW ARTICLE WITH HIGH ASPECT RATIO

(75) Inventors: Deepak Upadhyaya, Fremont, CA (US); Karthik Boinapally, Fremont, CA (US); William J. Boardman, Danville, CA (US); Matthew MaMoody, Oakland, CA (US); Thomas B. Casserly, San Ramon, CA (US); Pankaj Jyoti Hazarika, Midland, TX (US); Duc Doan, San Jose, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 300 days.

(21) Appl. No.: 12/970,183

(22) Filed: Dec. 16, 2010

(65) Prior Publication Data
US 2011/0151141 A1 Jun. 23, 2011

Related U.S. Application Data

(60) Provisional application No. 61/288,193, filed on Dec. 18, 2009, provisional application No. 61/288,185, filed on Dec. 18, 2009, provisional application No. 61/288,178, filed on Dec. 18, 2009, provisional application No. 61/288,172, filed on Dec. 18, 2009, provisional application No. 61/370,659, filed on Aug. 4, 2010.

(51) Int. Cl.
| | |
|---|---|
| *C23C 16/00* | (2006.01) |
| *C23C 16/04* | (2006.01) |
| *C23C 16/503* | (2006.01) |
| *C23C 16/26* | (2006.01) |
| *H01J 37/32* | (2006.01) |

(52) U.S. Cl.
CPC ............ *C23C 16/045* (2013.01); *C23C 16/503* (2013.01); *C23C 16/26* (2013.01); *H01J 37/32394* (2013.01); *H01J 37/32568* (2013.01)
USPC .......................... 427/569; 427/237; 427/249.7

(58) Field of Classification Search
USPC ................ 427/569, 237; 118/723 R, 723 MP, 118/723 E, DIG. 10
See application file for complete search history.

(56) References Cited

U.S. PATENT DOCUMENTS

| | | | |
|---|---|---|---|
| 4,600,659 | A | 7/1986 | Hong et al. |
| 6,914,919 | B2 | 7/2005 | Watson et al. |

(Continued)

FOREIGN PATENT DOCUMENTS

| | | |
|---|---|---|
| EP | 2009050293 A | 5/2009 |
| GB | 2030180 A | 4/1980 |

OTHER PUBLICATIONS

H.S. Maciel et al., "Studies of a Hollow Cathode Discharge Using Mass Spectrometry and Electrostatic Probe Techniques", Technological Inst. of Aeronautics, Dept. of Physics—Plasma and Processes Laboratory (LPP), 12228-900, ITA-CTA, Sao Jose dos Campos, SP, Brazil, 11 pages. (retrievable at 12th Int'l Congress on Plasma Physics, Oct. 25-29, 2004, Nice (France)).

*Primary Examiner* — David Turocy
(74) *Attorney, Agent, or Firm* — Law Offices of Thomas Schneck

(57) ABSTRACT

A method and apparatus for plasma enhanced chemical vapor deposition to an interior region of a hollow, tubular, high aspect ratio workpiece are disclosed. A plurality of anodes are disposed in axially spaced apart arrangement, to the interior of the workpiece. A process gas is introduced into the region. A respective individualized DC or pulsed DC bias is applied to each of the anodes. The bias excites the process gas into a plasma. The workpiece is biased in a hollow cathode arrangement. Pressure is controlled in the interior region to maintain the plasma. An elongated support tube arranges the anodes, and receives a process gas tube. A current splitter provides a respective selected proportion of a total current to each anode. One or more notch diffusers or chamber diffusers may diffuse the process gas or a plasma moderating gas. Plasma impedance and distribution may be controlled using various means.

14 Claims, 10 Drawing Sheets

(56) References Cited

U.S. PATENT DOCUMENTS

| | | |
|---|---|---|
| 7,160,616 B2 | 1/2007 | Massler et al. |
| 7,300,684 B2 | 11/2007 | Boardman et al. |
| 7,351,480 B2 * | 4/2008 | Wei et al. .................. 428/634 |
| 7,541,069 B2 | 6/2009 | Tudhope et al. |
| 2006/0196419 A1 * | 9/2006 | Tudhope et al. ............. 118/715 |
| 2006/0198965 A1 * | 9/2006 | Tudhope et al. ............. 427/569 |
| 2006/0216515 A1 | 9/2006 | Kazahaya et al. |
| 2006/0254518 A1 * | 11/2006 | Ellingboe ............. 118/723.001 |
| 2007/0262059 A1 * | 11/2007 | Boardman et al. ......... 219/121.5 |
| 2008/0044960 A1 | 2/2008 | Al-Bayati et al. |
| 2008/0292806 A1 | 11/2008 | Wei et al. |
| 2009/0311443 A1 * | 12/2009 | Boardman et al. ............ 427/569 |

* cited by examiner

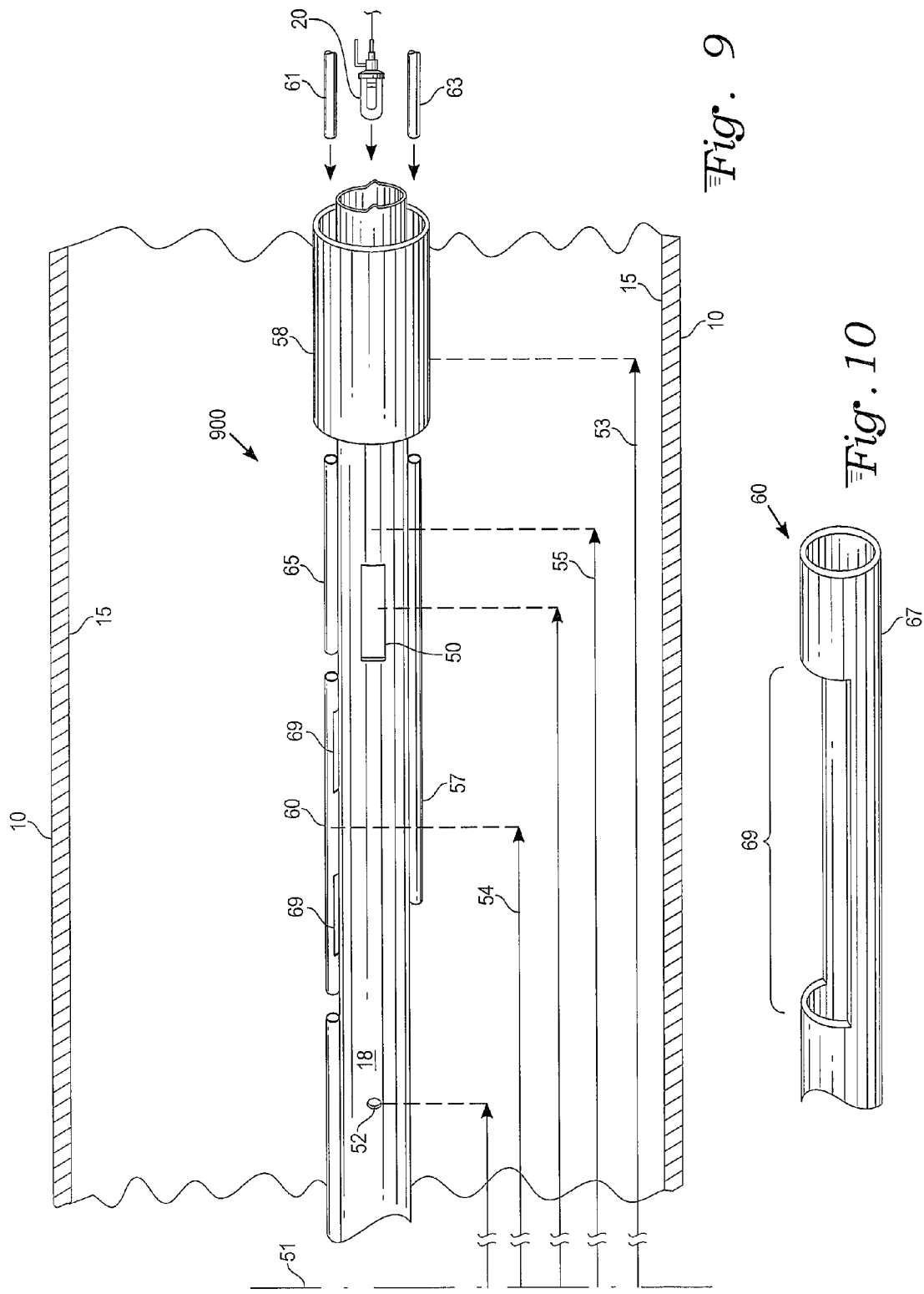

CHEMICAL VAPOR DEPOSITION FOR AN INTERIOR OF A HOLLOW ARTICLE WITH HIGH ASPECT RATIO

CROSS-REFERENCE TO RELATED APPLICATIONS

This application claims priority from prior U.S. provisional patent application Ser. No. 61/288,193 filed Dec. 18, 2009, prior U.S. provisional patent application Ser. No. 61/288,185 filed Dec. 18, 2009, prior U.S. provisional patent application Ser. No. 61/288,178 filed Dec. 18, 2009, prior U.S. provisional patent application Ser. No. 61/288,172 filed Dec. 18, 2009, and prior U.S. provisional patent application Ser. No. 61/370,659 filed Aug. 4, 2010.

TECHNICAL FIELD

The present invention relates generally to coating processes and in particular to chemical vapor deposition (CVD) applied to an interior surface of a hollow article.

BACKGROUND

Plasma Enhanced Chemical Vapor Deposition (PECVD) methods for coating external surfaces of a workpiece within a vacuum chamber are well known. The coating of interior surfaces of hollow workpieces, such as pipes, using PECVD techniques is less common, but has been described in U.S. Pat. No. 7,300,684 to Boardman et al., which utilizes a high deposition rate PECVD technique. The Boardman et al. method involves using the workpiece itself as a vacuum chamber, coupling a gas supply to one opening and a vacuum pump to another, and employing a voltage biasing system in which the negative terminal is attached to the pipe and the return anodes are located near the ends of the pipe but isolated from the pipe. The gas supply provides hydrocarbon precursors and the voltage biasing system is used to generate a high density hollow cathode plasma and to attract hydrocarbon ions to the surface, so as to form a diamond-like carbon (DLC) film on the interior surface of the pipe. Alternatively, non-hydrocarbon precursors can be utilized to form coatings other than DLC.

As used herein, the term "hollow cathode effect" is an occurrence such as in a tubular geometry with an axial anode, in which at least two cathode surfaces are positioned facing each other with a space between the cathode surfaces and the anode, and biasing and pressure parameters are such that a large increase in current is achieved as compared to a conventional plasma glow. Such cathode surfaces can be coaxial internal wall surfaces in a pipe. The increase in current is due to the "oscillation motion" of fast (hot, accelerated) electrons between the opposite space charge sheaths, which enhances the excitation and ionization rates in the plasma several orders higher than in the conventional glow discharge. The following definitions and descriptions of the hollow cathode effect are contained in the publication entitled "STUDIES OF HOLLOW CATHODE DISCHARGES USING MASS SPECTOMETRY AND ELECTROSTATIC PROBE TECHNIQUES" by H. S. Maciel et al., $12^{th}$ International Congress on Plasma Physics, 25-29 Oct. 2004, Nice (France). Hollow cathode discharges are capable of generating dense plasma and have been used for development of high-rate, low-pressure, high-efficiency processing machines. The geometric feature of a hollow cathode discharge promotes oscillations of hot electrons inside the cathode, thereby enhancing ionization, ion bombardment of inner walls, and other subsequent processes. At the same time, the hollow cathode exhibits plasma density one to two orders of magnitude higher than that of conventional planar electrodes. "It is well known that the product (Pd), of the inter-cathode distance (d) by the pressure (P), is an important parameter to describe the behavior of the HC discharge. Usually, the electron-atom inelastic collision rates are increased by the decrease of the inter-cathode distance with a large effect on the plasma density and electron temperature. The effect of the gas pressure on the discharge properties is expected since the increase in the collisionality by increasing the pressure tends to enhance the hollow cathode effects being possible to reach an optimized reduced inter-cathode distance (Pd)."

The system described in the Boardman et al. patent operates well for its intended purpose. However, for relatively long and high aspect ratio passageways, there are potential difficulties with maintaining plasma uniformity down the full axial length. As used herein, the "aspect ratio" of a passageway within a pipe or other workpiece is defined as the ratio of the length of the passageway to the cross sectional dimension (typically, a diameter) of the passageway. In conventional approaches, a pipe or other tubular workpiece may be placed for external coating in a chamber in which dimensions are designed such that there is little change in pressure throughout the chamber. However, when using the interior of the workpiece as the chamber, the dimensions of the chamber are defined by the intrinsic internal dimensions of the workpiece. For high aspect ratio workpieces in which the hollow cathode effect is utilized, there is a weak plasma within the central region of the interior passageway of the workpiece, while the ends of the passageway have an intense plasma. One possible explanation is that a high impedance is encountered by electrons leaving the center of the workpiece (which is biased as the cathode) while a lower impedance is encountered by electrons leaving the ends. As a result, electron current is shunted to the ends of the workpiece.

One possible solution is described in US Publication No. 2006/0196419 to Tudhope et al., which is assigned to the assignee of the present invention. As described in this reference, the interior surface of a workpiece can be coated in sections. Rather than having anodes attached at the opposite ends of the workpiece, a pair of anodes are located within the workpiece at a distance from each other and are systematically moved along the length of the workpiece. Thus, while the aspect ratio of the workpiece is not controllable, the aspect ratio of the section being coated is controlled. Another method relevant to the Boardman et al. patent is described in US Publication No. 2006/0198965. Rather than a continuous flow in one direction, the flow of gas is systematically reversed for the purpose of providing a more uniform coating along the interior surface of the workpiece.

While the use of the hollow cathode effect is not described, other approaches that are of interest are described in U.K. Patent Application No. 2030180 A to Sheward. In one embodiment described in Sheward, a positively biased anode extends along the length of the interior passageway of a tube being internally coated. In an alternative embodiment, the solid anode is replaced with an anode having a series of holes through which relevant gas is released.

A concern with placing an anode wire along the axis of a high aspect ratio passageway is that while a plasma may be maintained, the hollow cathode effect is easily lost and the deposition rate is lowered. Moreover, as the plasma impedance down a long workpiece can vary for many different reasons, including differences in pressure, gas composition, distance between the electrodes, and incidental coating of the anode wire, plasma intensity is further reduced and/or "hot spots" develop as plasma concentrates at one or more still high conductivity regions of the anode.

Tubular structures with coated interior carrier surfaces are described in U.S. Pat. No. 7,351,480 to Wei et al. Plasma immersion ion processing for coating of hollow substrates is described in US Publication No. 2008/0292806 A1.

Further improvements to the coating of high aspect ratio passageways are sought.

SUMMARY

A method, a system and an apparatus for plasma enhanced chemical vapor deposition (PECVD), using multiple anodes, are disclosed. Using PECVD, a coating is deposited to surfaces of an elongated interior region of a hollow workpiece.

Multiple anodes are inserted, in longitudinally spaced apart arrangement, along an elongated interior region of the workpiece. A holder is dimensioned to distribute the anodes along the interior region of the workpiece. The holder may have an elongated support tube which fits in the interior region of the workpiece and arranges the anodes along the interior of the support tube.

A process gas is introduced into the interior region of the workpiece. The holder has a process gas conduit which is connectable to deliver the process gas to the interior region of the workpiece. The support tube, positioning the anodes, may be operable to receive a process gas tube that delivers the process gas.

A respective individualized DC or pulsed DC bias is applied to each of the anodes. This bias excites the process gas into a plasma, for applying a coating to interior surfaces of the workpiece. The workpiece is biased as a cathode.

An electrical biasing circuit provides the individualized DC or pulsed DC bias to each anode. The electrical biasing circuit may make use of a current splitter connected such that each anode is provided a DC or pulsed DC current at a respective selected proportion of a total current.

Pressure is controlled inside the workpiece, so that the plasma is maintained. A hollow cathode effect may be achieved in the plasma.

A chamber diffuser may be used to diffuse the process gas into the interior of the workpiece. A plasma moderating gas may be introduced, and diffused into the interior of the workpiece using a notch diffuser. Further, plasma impedance and distribution may be controlled using various means.

A chemical vapor deposition interior-coated apparatus has a hollow tubular substrate of high aspect ratio greater than or equal to about thirty to one, with a diamond-like or doped diamond-like coating layer. The diamond-like or doped diamond-like coating layer has a substantially uniform thickness greater than about twenty microns. The diamond-like or doped diamond-like coating layer has a substantially uniform hardness greater than about nine gigapascals.

BRIEF DESCRIPTION OF THE DRAWINGS

FIG. 9 is a perspective view of a variation of the apparatus of FIG. 1, showing an anode support tube or lance inserted into an elongated interior of a workpiece.

FIG. 10 is a perspective view of a notch diffuser suitable for use in the apparatus of FIG. 9.

DETAILED DESCRIPTION

Figure 1:
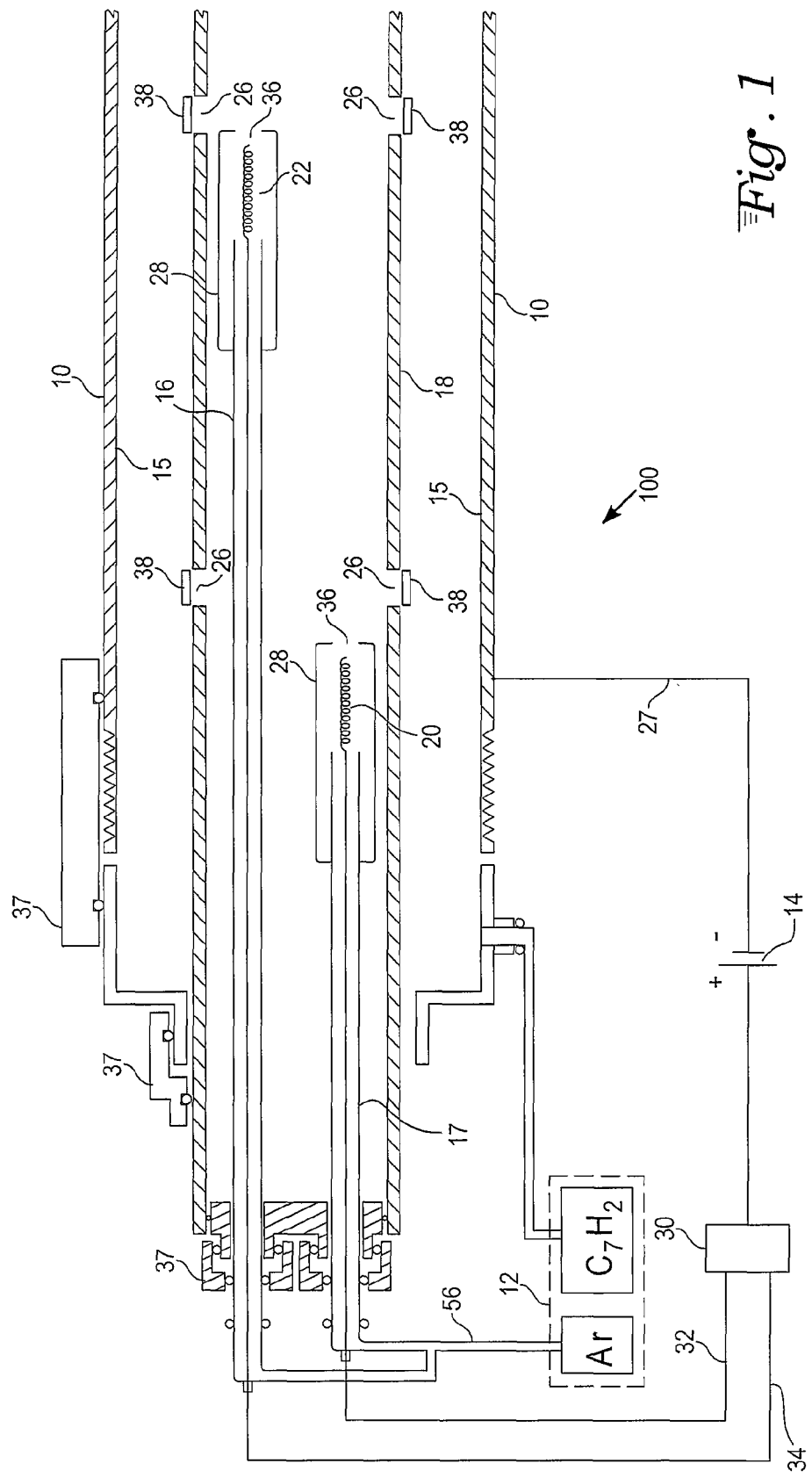
FIG. 1 is a diagram of a system using a holder having multiple anodes for plasma enhanced chemical vapor deposition to an interior region of a workpiece in accordance with an embodiment of the present invention.

With reference to FIG. 1, the present invention provides a system 100, an apparatus and a method for applying a plasma enhanced chemical vapor deposition coating to an elongated interior region of a hollow pipe, tube or similar structure, all called "workpiece". Multiple anodes, each of which is individually electrically biased, are disposed in a workpiece, resulting in a more uniform coating of the interior region of the workpiece. Advantage is gained by the employment of the hollow cathode effect. It will, however, be appreciated that some of the aspects of the system and method described herein may be adapted with a plasma being generated that is not a hollow cathode type.

In accordance with the invention, a high deposition rate uniform coating of a high aspect ratio interior passageway is enabled by providing safeguards against "hot spots" along a lengthwise anode or an arrangement of multiple anodes within a workpiece being internally coated. In an embodiment, a diamond-like coating (DLC) is applied to a workpiece with an aspect ratio of greater than 30:1, and in a further embodiment a coating is applied to a workpiece with an aspect ratio greater than 100:1. This range of embodiments defines "high aspect ratio" workpieces, i.e., pipes, tubes and the like.

Hot spots are those areas along the anode length at which conditions are unintentionally more conducive to plasma development than other areas along the anode length, so as to lead to inconsistent or incomplete coating along the length of the workpiece. The possible development of hot spots can be controlled electrically with multiple anodes and current splitting. It is also controlled mechanically with anode 20 placement, an anode support tube 18, gas injection placement, gas diffusers or multiple gases. For a high quality DLC coating, the temperature measured on the outside of the workpiece should be less than 600 F (about 315.5 degrees C.) and above 200 F (about 93 degrees C.) and preferably below 500 F (about 260 degrees C.) and above 250 degrees F. (about 121 degrees C.).

For applications such as corrosion resistance, the coating applied to an article must be thick enough to prevent any corrosive material from reaching the substrate. Also for abrasion or erosion applications, the coating must be thick enough to prevent deformation of a soft substrate. Rapid deposition of coatings thicker than 10 microns, 20 microns, and greater than 40 microns are observed. A deposition rate of greater than 5 microns per hour or preferably greater than 8 microns per hour can be achieved.

To achieve high deposition rates with low pressure drop, precursors with a high number of carbon atoms per molecule are used as a process gas. For example, ethane has a higher deposition rate than methane, as each ion of ethane will deliver twice as much carbon as each ion of methane. Additionally, it has been found that double and triple bonded carbon molecules provide higher deposition rates than single bonded carbon molecules. For example, ethyne (acetylene) produces a higher rate than ethene, and ethene a higher rate than ethane. Suitable process gases include, singly or in various combinations with other gases, methane, ethane, ethene, acetylene, silane, methylsilane, tetramethylgermanium and tetramethylsilicon. Various hydrocarbons are suitable for use in or as a process gas.

Further, to achieve high deposition rates the highest current and highest pulsed DC power duty cycle is used without exceeding the temperature limits (550 degrees F.) to achieve a high quality DLC coating and without causing arcing. For a high rate process, the highest pressure is used that achieves a high quality coating avoiding gas phase nucleation, which occurs at high pressures. In an embodiment, the average pressure is less than 400 mtorr but greater than 50 mtorr and the current flux is between 2.4 mA/cm$^2$ and 9.5 mA/cm$^2$. In a further embodiment, the average pressure is between 150 mtorr and 250 mtorr and the current flux is between 3.5 and 7 mA/cm$^2$, with the flux being equal to the average current per pulse divided by the surface area of the interior of the workpiece 10. An example high quality DLC coating that is deposited on the interior of a pipe using an embodiment of the disclosed method, system and apparatus has hardness greater than 8 GPa (gigapascals) and preferably greater than 10 GPa, with a coefficient of friction less than 0.1, is impervious to 15% HCL at room temperature, and has thickness uniformity of less than +/−20% and preferably less than +/−15%.

Figure 2:
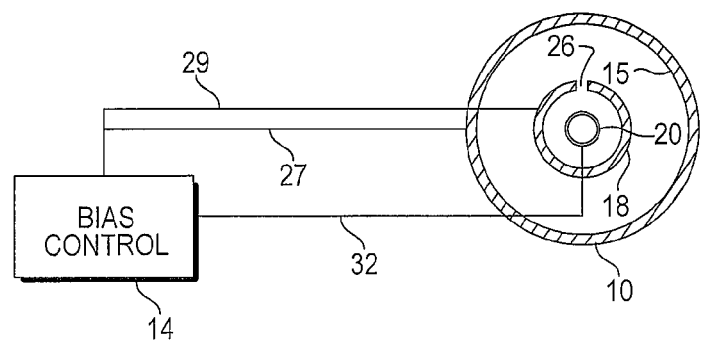
FIG. 2 is a diagram of a biasing arrangement for the apparatus of FIG. 1.

As shown in FIG. 1, a mechanical approach to reducing the likelihood of hot spots in a PECVD system 100 is to locate the anode 20 or anodes 20 within an elongated internal anode support tube 18, which is then placed within the workpiece 10. The anode support tube 18 may be biased as a cathode in order to promote a high deposition rate by maximizing the hollow cathode effect. Electrically, the bias control subsystem 14 may be connected to establish both the workpiece 10 and the anode support tube 18 as cathodes, as shown in FIG. 2. This establishes the cathode arrangement described above with reference to the hollow cathode effect. However, in the preferred applications the required "facing" cathodes for the hollow cathode effect are defined by the opposite interior wall portions of the cylindrical workpiece 10 facing each other across the hollow interior space of the workpiece 10.

In order to provide the environment in which the hollow cathode effect is promoted uniformly down the length of the workpiece 10, the anode-covering or anode support tube 18 within the workpiece 10 is formed of a conductive material that is biased as a cathode, i.e. a voltage lower than the anode, while the workpiece 10 is also biased as a cathode, perhaps at the same voltage or a nearby voltage.

Moreover, for embodiments in which a series of anodes 20 are utilized, the spacing between adjacent anodes 20 as compared to a diameter of a hollow tubular workpiece is less than a first spacing aspect ratio, but greater than a second spacing aspect ratio. This first spacing aspect ratio is approximately 15:1 and the second spacing aspect ratio is approximately 1:1. This creates a hollow cathode condition, rather than a glow discharge condition. A ratio of spacing between anodes to the internal diameter of the workpiece that is greater than about 20:1 results in overheating of anodes and cooling and reduction or loss of plasma. A ratio of spacing between anodes to the internal diameter of the workpiece that is less than about 1:1 can effectively short out neighboring anodes, resulting in loss of individual control of anodes when the anodes are too close.

In a preferred embodiment the anode-covering or anode support tube 18 is not biased but allowed to float electrically. By minimizing the diameter of the anode support tube 18 and keeping the above-mentioned spacing, it has been found that a high deposition rate process is maintained. Since a smaller diameter anode-covering or anode support tube 18 provides both less pressure drop and a higher deposition rate, it is important that the materials used to provide electrical and purge gas connection to the interior anodes 20 be as small in diameter as possible, while providing good electrical and thermal protection.

There are benefits to forming the anode support tube 18 of ceramic or a ceramic-covered metal. A ceramic liner may be placed inside the anode support tube 18. For applications in which the internal tube or anode support tube 18 is not biased as a cathode and/or in applications in which the internal tube is still able to function as a cathode, the ceramic coating may also be applied to the exterior of the tube. During the process of coating the interior surface of the workpiece, this anode-covering or anode support tube 18 will also be coated. Flaking of this incidental coating is less likely to occur with this use of a ceramic, since ceramic has a better adhesion to coating material such as DLC. Alternately, a metal anode holder can have the surface slightly roughened by a technique such as sand blasting, as this roughened surface will also provide better adhesion of the coating and will reduce the likelihood of flaking. Other coatings or surface treatments to the internal tube could be used to directly increase the adhesion, or the surface area, to promote adhesion.

FIG. 1 shows a conductive pipe, component, article or other workpiece 10 connected in a PECVD system 100 that includes a gas supply subsystem 12 and a bias control subsystem 14. The workpiece 10 is shown as a single piece, but may be an assembly of tubes or pipes. A coating precursor gas, such as methane or acetylene, may be provided by the gas supply subsystem 12. This gas is used in implantation or coating steps that will be described below. Argon or another suitable inert gas may be provided as a second gas to allow plasma "pre-cleaning" of the interior surface 15 of the pipe or other workpiece 10. During the implantation or coating step, the inert gas may be mixed with the treatment gas.

The gas supply 12 and/or the pumping speed control valve are controlled to provide the pressure for establishing the hollow cathode effect plasma for a given diameter workpiece 10. While not shown in FIG. 1, a vacuum subsystem is provided at the opposite end of the workpiece 10. Vacuum connections 37 are provided where needed, and these connections can also supply electrical isolation as appropriate. The vacuum connections 37 may include end-caps, bands, O-rings or other sealing elements. In one embodiment, the system has gas introduced alternately from one end and then the other with pumping alternating from the opposite end. Additionally in this arrangement some percentage of the gas can be injected into the workpiece itself at one or more locations within the interior of the workpiece 10. In an arrangement for very high aspect ratios, gas is injected into the interior of workpiece 10 using a tube with optimally spaced and sized holes that can be placed within the anode holder or anode support tube 18 or attached to it. The gas is pumped out of the pipe or other workpiece 10 using a pumping arrangement that pumps equally from both ends of the workpiece 10 simultaneously. Both of these arrangements help to minimize the pressure drop down the interior region of the workpiece 10, thus allowing more uniform coating and higher flows with a resulting higher deposition rate.

The pressure settings should be such that the pressure within the interior of the workpiece 10 establishes a condition in which the electron mean free path is related to the distance between the interior surfaces 15 of the workpiece 10 and the exterior surface of the anode support tube 18 that houses a number of anodes 20 and 22 (in the case where the anode support tube 18 is powered as a cathode). In the case where the anode support tube 18 is floating electrically, this pressure should be related to the inner diameter of the workpiece 10. While only two anodes 20 and 22 are shown in FIG. 1, the uniformity of plasma intensity is promoted if the anodes 20 extend along the length of the workpiece 10 being internally coated. The anode support tube 18 is used to provide support for the internal anodes 20 and 22 and in one embodiment gas distribution injector(s). In one embodiment the anode support tube 18 is pre-stressed and kept under tension by pulling on the tube 18 from both ends, to prevent "sagging" due to gravity and thermal expansion from plasma heating.

In one embodiment, the anode support tube 18 is an internal metal tube that is used to hold a gas distribution injector in addition to being an anode holder, to allow the coating of a high aspect ratio hollow workpiece 10. Holes 26 are placed along the length of the gas injector tube with the size and/or spacing of the holes being designed so that gas flow into each section of the workpiece is relatively equal. The gas injector tube can be placed within the anode support tube 18 or attached to the outside. Holes 26 are also placed in the anode support tube 18 such that the hollow cathode effect is established along the length of the workpiece. The anode support tube 18 has a series of holes 26 that are spaced in order to allow electron access to the anode 20 or anodes. The distance between the holes 26 should be sufficiently small to prevent weak plasma (or "cold spots") from forming between the holes 26. Cold spots will form in the center of high aspect ratio cathodes (particularly in the case of a long pipe, where the only anodes are at the opposite openings), if the anodes are too remote from the center of the cathode. Electrons which are generated at the center of the workpiece 10 are furthest from either anode and have the highest impedance path to travel to reach the anodes. Thus, at a certain critical aspect ratio of the workpiece 10, the plasma impedance from the center of the cathode-biased workpiece to the anodes will become too large and current will shunt to the ends of the workpiece. This is demonstrated both by a cold temperature in the center and high temperatures at the ends and by a thinner coating in the center and a thicker coating at the ends. The typical maximum spacing aspect ratio is on the order of 15:1, although some of the described embodiments may increase or decrease this figure. Both the spacing between the anodes and the spacing between the holes 26 in the anode support tube 18 are used to control plasma impedance. The distance of the interior anode 20 to the exterior hole 26 in the anode support tube 18 can also be used to control plasma impedance. Additionally, the size of the holes 26 may be used to control impedance due to such factors as restricting or increasing electron and argon flow. As shown in FIG. 1, the size of the holes 26 may be adjusted using movable sleeves 38. This provides several benefits including providing some control of the plasma, with a smaller hole increasing the plasma impedance due to less access of electrons to the interior anode. These sleeves also provide a baffle for gas flow coming from the inside of the tube 18, preventing turbulence that could negatively affect the coating on the inside of the workpiece 10.

With respect to the anode-covering or anode support tube 18, the diameter is minimized in order to increase the potential deposition rate by providing less blocking of the hollow cathode effect. If the interior ceramic or metal anode support tube 18 has a diameter that is unnecessarily large, more electrons will reside within the tube 18 and therefore fewer electrons will be available for ionization-increasing collisions. There are also a number of pneumatic considerations. A reduction in the diameter of the anode-covering or anode support tube 18 within the workpiece 10 will also reduce the pressure drop as measured along the length of the workpiece 10. Additionally, if gas is injected uniformly down the interior of the workpiece 10 from the spaced holes 26 of the tube 18, the total pressure drop will be reduced and the likelihood of significant reactive gas depletion similarly will be reduced. In an embodiment, a pressure drop of less than 500 mtorr is used and in a further embodiment the pressure drop is less than 250 mtorr. A high deposition rate is important for a commercially viable coating. The amount of gas required and the amount of ion current required are both proportional to the surface area of the workpiece 10 to be coated. Therefore, for a high deposition rate process, both high gas flows and high power supply currents are factors. High gas flows increase the pressure drop down the pipe or other workpiece 10 but reduce the residence time. High currents greatly increase the likelihood of "hot spots" and arcing.

FIG. 1 illustrates the connection of the individual anodes 20 and 22. In this embodiment, each anode 20 and 22 may be separately controlled. This allows the use of differential mode transformers 30 (or current splitters) as will be described below when referring to FIGS. 4, 5, and 6. Each anode line 32 and 34 from the bias control subsystem 14 may be protected within an electrically insulating pipe 16 and 17 (e.g. of ceramic material). Such an electrically insulating pipe 16 and 17 provides electrical isolation between the anodes 22 and 20 so that the current splitters 30 can apply different voltages to each anode 20 and 22, in addition to providing thermal protection. The insulating tube 16 or 17 is also used to feed inert gas (e.g. argon) to the anode 22 or 20, as an anode gas. This has several advantages including maintaining a higher pressure region around the anode 20 or 22, which prevents reactive gas from depositing on the anode 20 or 22, which will increase the impedance of the anode in the case of a semi-insulating coating such as DLC. Because argon is an easily ionized gas, it also provides a low impedance plasma around the anode when used as an anode gas. A quartz shield 28 with a small diameter hole 36 at the end can be used to maintain a high pressure inert gas purge, using an anode gas, around the anode 20. The quartz shield 28 (or similar high temperature material) is used to provide thermal protection from the high intensity, hot plasma emitted from the anode 20, preventing damage to neighboring anode 22 tubes. Quartz sleeves are also used to protect any exposed joints in the ceramic to prevent unwanted current flowing to the anode wire in this area.

In an alternate embodiment, anodized metal (e.g., anodized aluminum) can be used as the electrically isolating tube, as this may provide a lower cost solution. This type of anode, which is anodized on the outer diameter and not anodized on the internal diameter, has the advantage of providing high electrical isolation between the outer diameters of the multiple anodes, with good conductivity at the active area of the anode (where the non-anodized interior surface is exposed). Quartz, ceramic or other high temperature material is used to provide thermal protection for the high temperature region around the active anode. The use of a small internal diameter tube provides a high pressure inert gas region around the active anode area by purging argon or other anode gas through the internal diameter of the anodized tube, without the need for an anode cover (e.g. quartz). In addition to the axially aligned anodes, there may be an anode at each end of the workpiece 10. These end anodes may play a dual function of providing a sealed environment and ensuring the proper electrical environment for establishing the hollow cathode effect.

With reference to FIG. 2, three connections are shown from the bias control subsystem 14. Connection lines 27 and 29 respectively bias the workpiece 10 and the internal tube 18 as cathodes. Connection line 32 biases the anode 20. The biasing of the components may be steady-state voltages, but there are advantages to providing DC pulses. A negative pulsed bias may be used to (a) create the necessary plasma, (b) draw an ionized reactive gas to the surface to be treated, (c) allow ion bombardment of the coating in order to improve coating properties, such as density and stress levels, and (d) allow control of coating uniformity by adjusting the duty cycle so as to permit replenishment of the source gas during the "off" portion of the cycle. An embodiment uses bipolar, dual frequency DC pulses. Current is pulsed at a high frequency between 10 kHz and 80 kHz, preferably between 10 kHz and 60 kHz and still more preferably 20 to 25 kHz. The high-frequency pulsing is burst during intervals at a low frequency less than about 20 hertz. The high frequency pulsing is mainly used to control the quality of the coating, with a higher duty cycle resulting in a harder DLC. A duty cycle of between 10% and 80% is used in one example, and a duty cycle of between 40% and 60% is used in a further example. The low frequency duty cycle, controlling the duration of intervals during which the high-frequency pulsing is burst, is used mainly to control gas precursor depletion in the case of high aspect ratio pipes. To prevent gaseous precursor depletion, the low frequency off time should be at least equal to the residence time of the gas to travel through the pipe or other workpiece 10. In order to achieve such a low frequency off time, the frequency itself and/or the duty cycle may be adjusted. The total duty cycle mainly controls the heating and deposition rate.

In an example, a high aspect ratio workpiece consisting of a 30 foot long pipe with 3 inch internal diameter is supplied with an average pressure of 200 mtorr with a flow rate of 700 sccm of gas and a low frequency of power pulsing of 0.5 Hz to 10 Hz. In a further example, a low frequency of power pulsing between 1 Hz and 3 Hz is used, with a duty cycle between 5% and 50%. In a still further example, a low frequency between 1 Hz and 3 Hz is used, with a duty cycle between 8% and 20%. Bipolar electrical pulsing can be used with the deposition pulse applying a comparatively large negative voltage to the workpiece 10 (cathode) with respect to the anode(s), while for the discharge pulse a comparatively small positive voltage is applied to the workpiece 10 with respect to the center anode(s) (in this case they are biased as cathodes). The purpose of the discharge pulse is to remove positive charge which builds up on the resistive DLC, which if not removed can cause arcing to occur. In an embodiment of this invention, the deposition voltage is between 400 V and 5 KV and in a further embodiment the deposition voltage is between 500 V and 2 KV.

Figure 3:
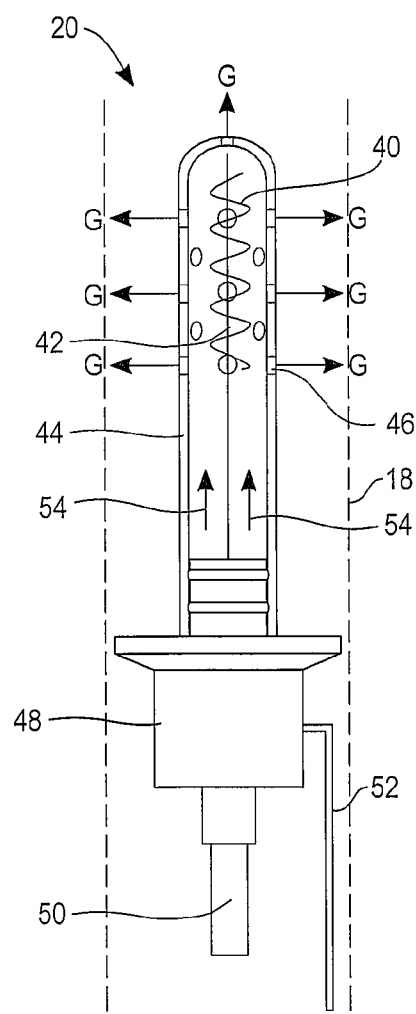
FIG. 3 is a diagram of an anode suitable for use in the apparatus of FIG. 1.

With reference to FIG. 3, one embodiment of the anode 20 is shown as described in U.S. Patent Application Publication No. 2007/0262059 to Boardman, which is assigned to the assignee of the present invention. An electrode material 40 is formed as a coil of filament wire and arranged so as to extend along a longitudinal axis, such that the open rings of the coil circle around the axis and create an interior zone 42. Surrounding the electrode material coil 40 is a shield 44 which may be formed of clear quartz, for example. The shield 44 defines a side wall with a number of holes 46 that have positions selected to suit the desired direction of plasma creation. In one embodiment, only one hole is placed at the top of the shield 44, with size sufficiently small to maintain a higher pressure of inert gas inside the shield compared to outside of the shield, so as to prevent reactive gas from coating the anode coil. Reactive gas is introduced through tube 52. These holes 46 may be aligned with the holes within the tube 18 to control anode impedance. For example if the spacing between an anode 20 and the closest hole in tube 18 is too small the plasma impedance will be very low and this can cause "arcing" to one or more anode(s), if the spacing is too large the impedance will be very high, which requires high voltage from the power supply and can exceed the limits of the supply. Alternatively, the functions of the shield may be performed by the internal tube 18. Thus, referring briefly to FIG. 1, rather than a number of anodes 20 and 22 contained within a single internal tube 18, the electrodes may be aligned in a manner in which each anode has a shield that functions as a segment of a discontinuous "interior tube."

Again referring to FIG. 3, the anode gas (G) that passes through the holes 46 in the shield 44 and passes through the holes 26 within the anode support tube 18, is inert and provides a low impedance non-reactive plasma around the anode 20. The electrode material 40 is preferably a refractory metal such as tungsten, tantalum, or molybdenum. If the electrode material is tungsten, a suitable diameter is one between 0.1 mm and 1.0 mm, and in one example is 0.2 mm. The electrode material enters a base portion 48 of the anode 20 and is electrically coupled to a terminal 50. This terminal is positioned at the outside of the base portion so as to allow connection to the anode line 32 from the bias control subsystem 14 of FIG. 1. The anode shown in FIG. 3 is an example of the external anode. Internal anodes have similar components, but connections of the gas lines at the base portion would occur outside the workpiece, so as to conserve space.

A gas inlet 52 enables supply of gas through the base portion 48 and into the interior of the shield 44, as indicated by arrows 54. While not shown in FIG. 1, each gas inlet 52 is connected to the anode gas supply line 56 from the gas supply subsystem 12. In an alternative embodiment, a larger area anode, such as a conductive rod, is used as the active anode. This has the advantage of reducing the current density and heating of the anode. In this case no shield or a shield with a larger hole size is used to provide full electron access to the anode surface and prevent heating.

With respect to FIGS. 4-8, electrical aspects relating to multiple anode systems are shown. In one electrical control embodiment, more than one anode is located within the passageway being coated. For example, a series of anodes may be located along the axis of the passageway and the anodes may be separately biased. The spacing of such anodes may or may not be uniformly distributed along the length of the workpiece. Even if all of the anodes are merely connected to a fixed voltage supply, the voltage drops across the short anodes will have less of an effect on plasma intensity than the voltage drop across a single anode that spans the length of the passageway. However, additional benefits are achieved in a more complex embodiment in which a differential mode approach is used in establishing the currents to the various anodes. For example, a differential mode transformer may provide currents to adjacent axially aligned anodes, such that changing current to one anode affects current to the adjacent anode. Because of this interaction of currents to different sections along the length of the workpiece, the formation of hot spots is retarded and the uniformity of coating is promoted.

Figure 4:
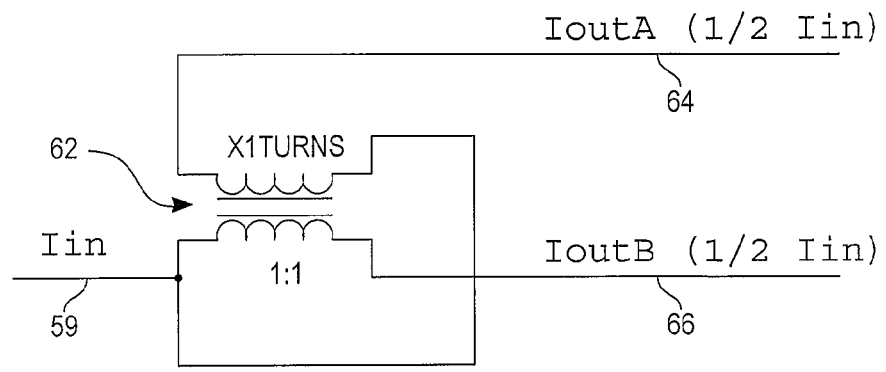
FIG. 4 is an electrical schematic of a differential mode transformer suitable for use in the apparatus of FIG. 1.
Figure 5:
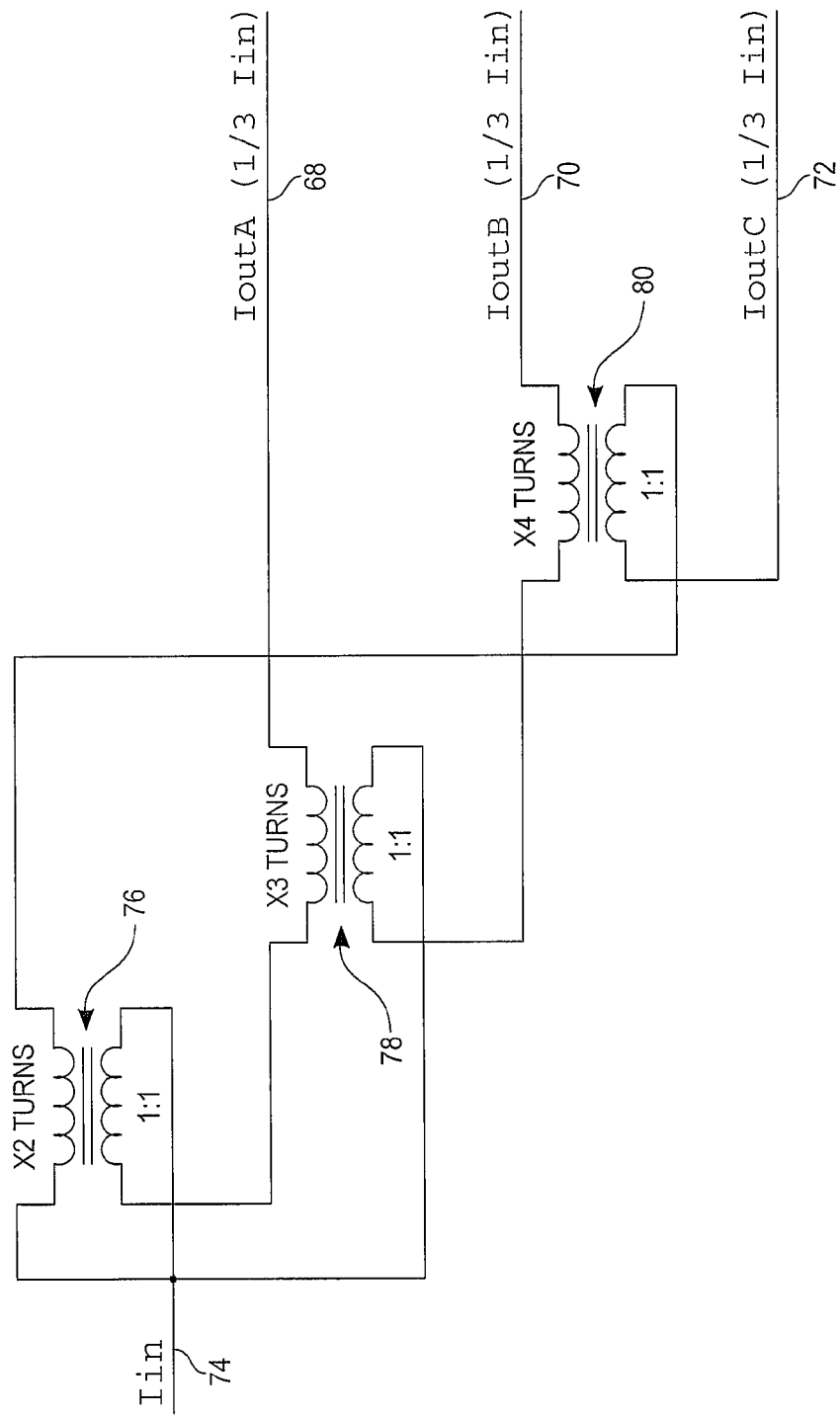
FIG. 5 is an electrical schematic of a current splitter suitable for use in the apparatus of FIG. 1 and making use of the differential mode transformer of FIG. 4, for three anodes such as the anode shown in FIG. 3.
Figure 6:
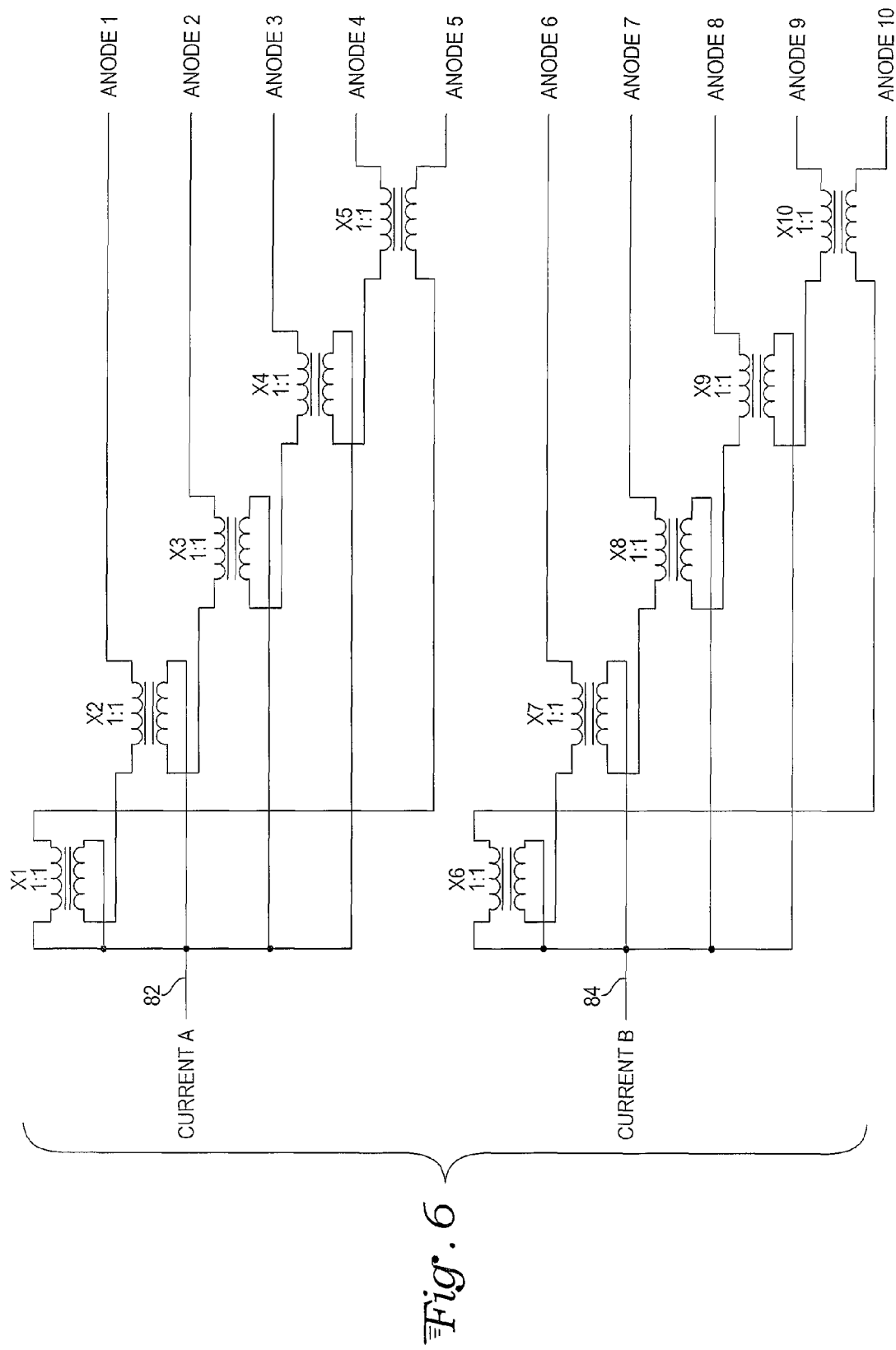
FIG. 6 is an electrical schematic of a current splitter as a differential mode transformer application for ten anodes such as the anode shown in FIG. 3.

FIGS. 4, 5, and 6 illustrate the use of differential mode transformers for supplying current to sets of two anodes, three anodes, and ten anodes, respectively. By using the differential mode transformers, the current for each section within the workpiece is similarly controlled. Anodes which are "wound against each other" provide compensation for the changes in plasma impedance generated by the adjacent anodes. This reduces the likelihood of formation of significant "hot spots" and "cold spots." That is, there is a greater uniformity of plasma along the length of the workpiece and the resulting coating is more uniform. In each of the anode current splitters of FIGS. 4, 5, and 6, coaxial or twisted-pair wiring may be used for the windings on a magnetic core.

With reference to FIG. 4, a two-way anode current splitter has the current input (Iin) provided to opposite sides of the two windings of transformer 62. Each resulting anode output line 64 and 66 receives one half of the current of the input 59. More significantly, a change of impedance of one of the anodes relative to the other anode will be at least partially compensated as a consequence of the interaction of the current pass. A difference in current flow between the two anodes feeding into the splitter will induce a voltage across the splitter that will tend to force the current difference toward zero.

With reference to FIG. 5, a divide-by-three arrangement is shown in which each of three current output lines 68, 70, and 72 is connected to a different anode to provide one-third of the current from an input 74. But the arrangement is more than merely a division of input current. Rather, there is interaction of current paths to the anodes, since each of three transformers 76, 78, and 80 has oppositely directed current flows through the windings of the transformer.

With reference to FIG. 6, a further example of a current splitter using differential mode transformers is shown. For situations in which a workpiece has a particularly large aspect ratio, the number of anodes required for ensuring appropriately sized segments of the workpiece will be large. For example, if each segment is one meter in length and the workpiece is ten meters, the interconnection to the first five anodes may be made through one end of the workpiece, while connections to the remaining five anodes may be made through the opposite end. This is represented in FIG. 6. A first current line 82 is associated with a series of transformers with oppositely directed currents, as described with reference to FIGS. 4 and 5. Thus, five anode currents interact with each other. Identically, a second current line 84 is associated with five transformers and five interacting anode currents. The first five anode currents may be directed along lines which enter from one side of a passageway while the remaining five anode lines enter from the opposite side.

Figure 7:
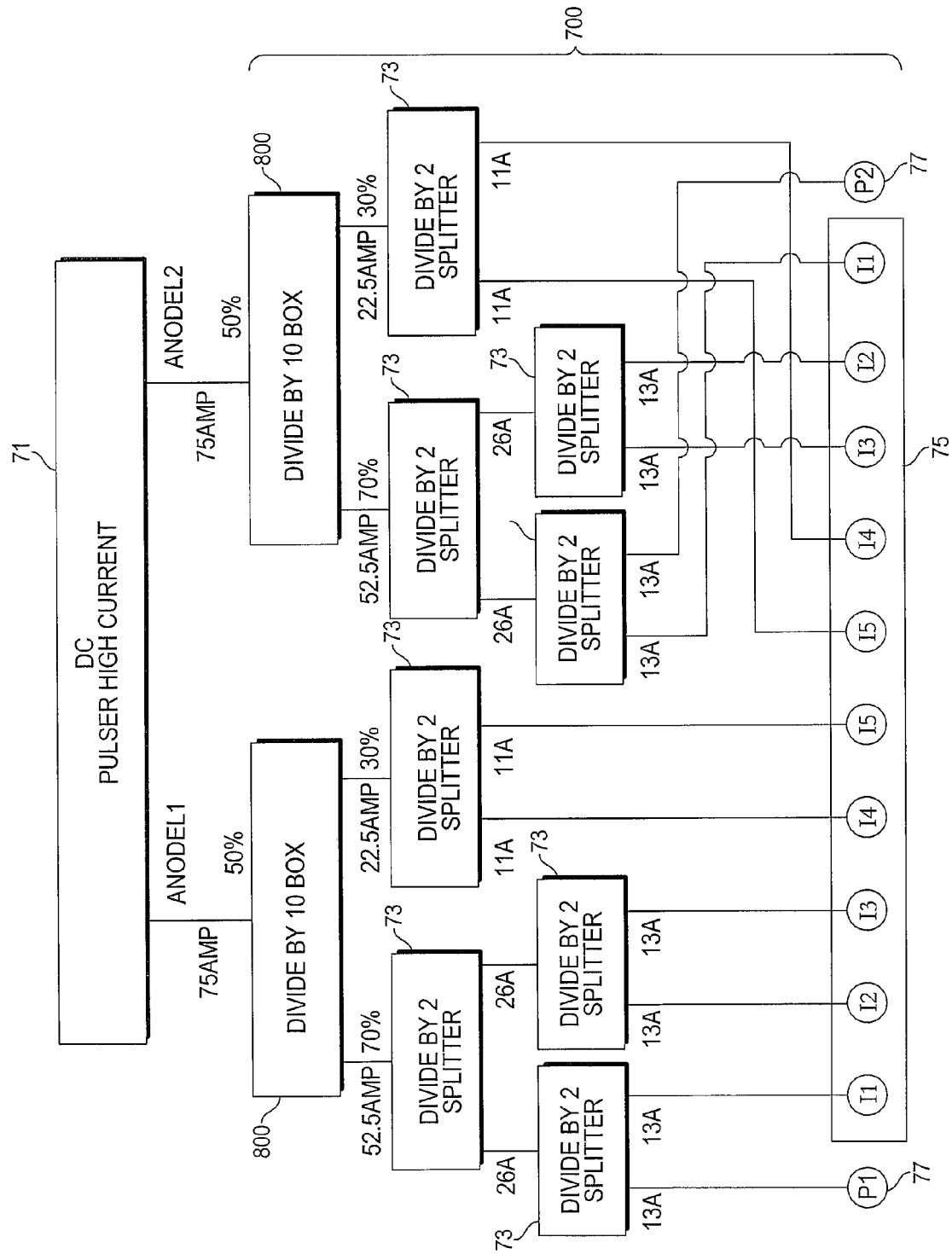
FIG. 7 is a block diagram of an anode and splitter network suitable for use in the apparatus of FIG. 1.

With reference to FIG. 7, a splitter 700 is shown as built up from further splitters in a network. In one embodiment the splitter network is combined such that regions of the workpiece that tend to develop "hot spots", and are believed to be associated with low plasma impedance, have a lower percentage of current directed to anodes in that area of the pipe. The splitter shown in FIG. 7 as a splitter network is suitable for a 30 feet (9.14 meters) long pipe with an aspect ratio of 120:1, with current split to drive ten internal anodes and two external anodes. Note that two variable output divide-by-ten splitters 800 are used. Each of these divide-by-ten splitter 800 boxes has two outputs (A and B) that allow the percentage current to be varied in increments of 10% from 10% to 90% by adjusting control switches (i.e., A=10% and B=90%, A=20% and B=80%, A=30% and B=70%, etc.). In the example, each of the divide-by-ten splitters 800 is set to split a respective input current by 70% and 30%. Eight divide-by-two splitters 73 are further connected to the two divide-by-ten splitters 800 so that the splitter network and splitter 700 provides the various individualized respective connections 77 and 75 and associated currents for the anodes to which the splitter 700 is connected. Each anode thus receives a respective selected proportion of the current supplied by the high current DC pulser 71, to which the splitter 700 is connected. Variations of the splitter 700 and further splitters and splitter networks may be devised.

In the embodiment shown in FIG. 7, the divide-by-ten splitter 800 boxes are combined with divide-by-two splitters 73 such that 11 amps of current are directed to each of the middle anodes 75, and 13 amps of current are directed to the end anodes 77. This data is typical but these ratios may be changed during the process or for different process conditions. Significantly, it has been determined that the spacing between adjacent anodes should be less than a specified aspect ratio, which has been identified as 15:1, i.e. anodes should be spaced apart by a distance less than fifteen times a diameter of the passageway. Such a spacing aids in creating the hollow cathode effect, rather than a glow discharge, although other spacings may be applied.

Figure 8:
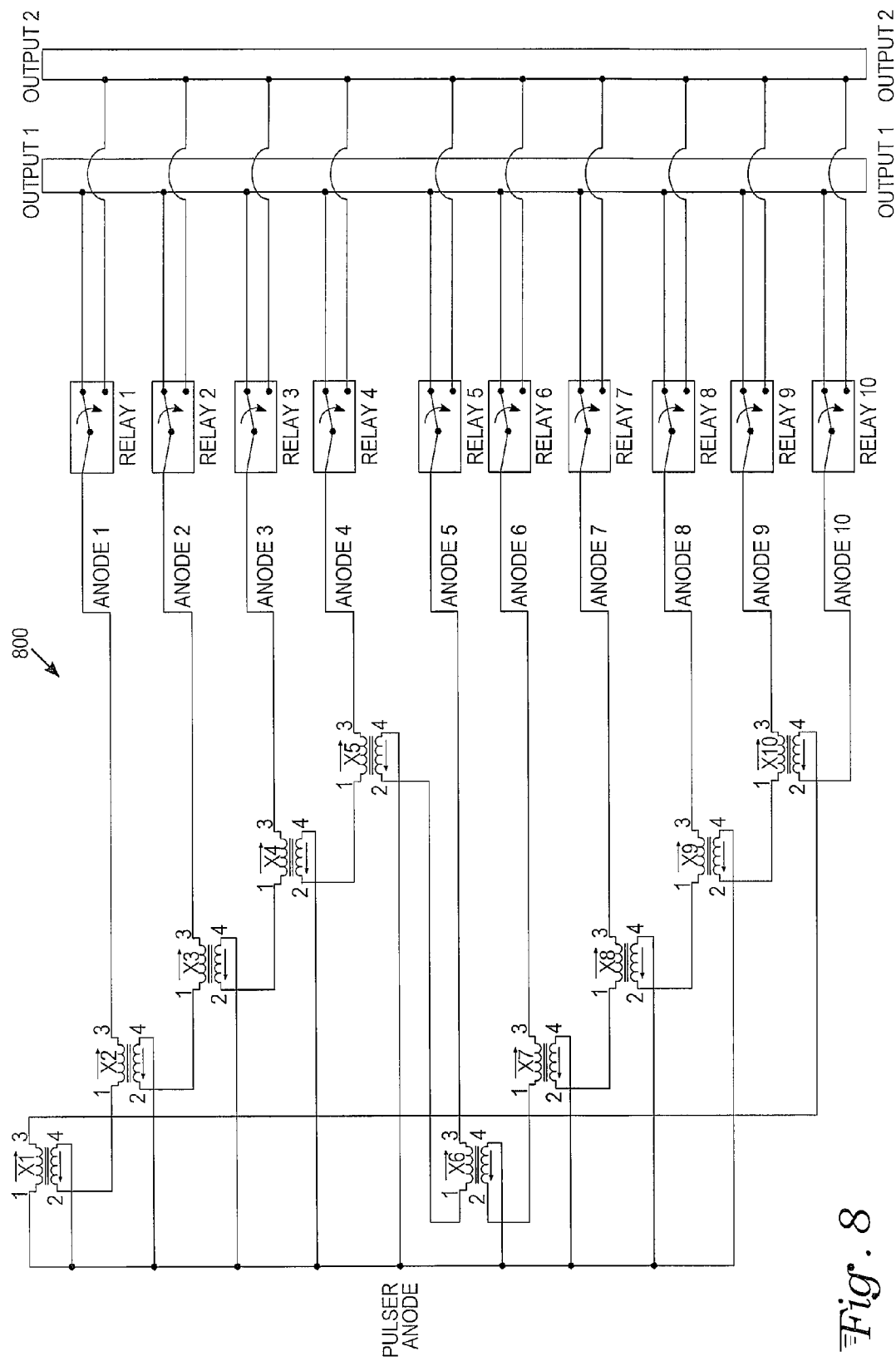
FIG. 8 is an electrical schematic of a variable output splitter network suitable for use in the apparatus of FIG. 1 or in the splitter network of FIG. 7.

With reference to FIG. 8, an electrical schematic diagram shows the divide-by-ten splitter 800 used in FIG. 7. The variable output divide-by-ten splitter 800 of FIG. 8 works in a manner related to the static five-way splitter in FIG. 6. Transformers X1 through X10 are connected in differential mode. A respective relay, e.g. Relay 1 through Relay 10, connects each of the ten splitter outputs (each output is 10% of the incoming current) to one pole of a relay or the other, with pole A going to a buss connected to output 1 and pole B going a buss connected to the other output, namely output 2. The relays are activated by ten switches on the outside of the box. If all ten switches are placed in the A position then 100% of the input current goes to output 1 and 0% goes to output 2. If two switches are in the A position, then 20% goes to output 1 and 80% to output 2, three switches=30% to output 1 and 70% to output 2, etc. By making the splitter larger (more outputs) the degree of current control becomes finer (a 100× splitter gives 1% increments, but this requires 100 splitters, and relays). Variations may be devised having a lesser or greater number of outputs and fineness of switchable increments of current.

With respect to FIG. 9, an anode and gas delivery assembly 900 is shown as an implementation of the apparatus of FIG. 1. The anode and gas delivery assembly 900 may be referred to as a lance, and is inserted into an elongated interior region of a hollow article or workpiece 10. Multiple anodes 20 are arranged inside the elongated anode support tube 18 of the anode and gas delivery assembly 900 or lance. A process gas supply line 63, tube or other conduit is attached to the outside of the anode support tube 18 of the lance. A plasma moderating gas supply line 61, tube or other conduit is further attached to the outside of the anode support tube 18 of the lance. An anode gas supply line, tube or other conduit is routed inside the anode support tube 18 of the anode and gas delivery assembly 900 or lance. The hollow article or workpiece 10 receiving an internal coating is biased as a cathode, and the lance or anode and gas delivery assembly 900 positions the multiple anodes 20 and portions of the gas delivery conduits within the hollow article or workpiece 10.

In the anode and gas delivery assembly 900 or lance example design shown in FIG. 9, larger anode slots 50 are placed close to the tip of the anode 20. These slots 50 are approximately 1.5 inch in length. Smaller holes 52 are placed between the anode slots 50 to allow some electron access between the anodes 20. This promotes a more uniform temperature distribution between the anodes 20, preventing the temperature from dropping between adjacent anodes. Referring again to FIG. 9, this shows the center section of the anode and gas delivery assembly 900 or lance design, with distance measured with reference to the center 51 of the length of the lance for the hydrogen injector hole locations 54 and process gas injection locations 53. The hydrogen injector holes are located on the hydrogen gas line 61. When the hydrogen injector gas line is installed to the anode support tube 18, these hydrogen injector holes are lined up with the hydrogen injector hole locations 54. Similarly, the process gas injection holes are located on the process gas line 63. When the process gas line is installed to the anode support tube 18, these process gas injection holes are lined up with the process gas injection locations 53. Also shown are the gas chamber diffusers 58 and the hydrogen notch type diffusers 60. The hydrogen gas injector is attached to the anode support tube 18 by slipping the hydrogen gas supply line 61 through support tubes 65 and hydrogen notch type diffusers 60 or other fittings on the top of the anode and gas delivery assembly 900 or lance. The reactive gas injector is attached to the anode and gas delivery assembly 900 or lance by slipping the process gas supply lines 63 through support tubes 57 and gas chamber diffuser 58 or other fittings on the bottom of the anode and gas delivery assembly 900 or lance.

A first set of anode and gas delivery assembly 900 or lance dimensions is given in the example design below, and the dimensions are applicable to the apparatus of FIG. 9. In one embodiment, an anode and gas delivery assembly 900, or lance, is dimensioned to fit into a 30 foot pipe having a diameter of a few inches which is to be coated on the inside using a plasma enhanced chemical vapor deposition. The anode and gas delivery assembly 900 includes an elongated anode support tube 18, which has fittings for hydrogen or other plasma moderating gas, fittings for process gas and mountings for multiple anodes 20. The process gas supply line 63 has process gas holes at specified locations 53, for injecting process gas. The hydrogen gas supply line 61 has hydrogen holes at specified locations 54, for injecting hydrogen. Upon insertion of the process gas supply line 63 and hydrogen gas supply line 61 into the anode and gas delivery assembly 900 or lance, the holes in the process gas supply line 63 and hydrogen gas supply line 61 are aligned with the specified locations, so that the respective gases may be dispensed into the respective diffusers. Locations of the hydrogen holes 54, process gas holes 53 and anode tips 55 are symmetric about the center 51 of the anode support tube 18, i.e. pairs of each are located at the stated distance from the center 51 of the anode support tube 18, one on either side of the center measured towards either respective end of the anode support tube 18. Hydrogen holes are located 2 inches, 15 inches, 38 inches, 66 inches, 86 inches and 132 inches from the center 51. Process gas holes are located 1 inch, 23 inches, 48 inches, 76 inches, 103 inches, 140 inches, 160 inches and 170 inches from the center 51. Anode tips are located 20 inches, 58 inches, 94 inches, 126 inches, and 154 inches from the center 51.

One aspect in various embodiments is controlling gas chemistry down the length of a long pipe. If precursor gas is introduced at one end of the pipe or other workpiece 10 and pumped out from the other end of the workpiece 10 as in at least one of the variations, the gas will react more rapidly at the entry end forming a thicker coating at an introduction end compared to the pump out end. Also as the reactant gas is consumed during the coating reaction, and byproducts are released, this difference in chemistry down the length of the pipe will cause additional differences in plasma impedance down the length of the pipe. These differences in plasma impedance are a result of differing ionization potentials as the chemistry varies along the length of the pipe. To correct this problem, at least one example uses a process gas injector line of small diameter e.g. approximately ⅛ inch with process gas release holes of the proper size, and spacing between the holes, to provide a uniform thickness coating down the length of the pipe. An example of a process gas injector design is described above, with reference to FIG. 9 and the dimensions applicable thereto. This design has process gas release hole sizes of approximately 12 mils for the process gas injector, which can be attached to the anode and gas delivery assembly 900 or lance. Since the process gas injector design is symmetrical the same hole pattern is repeated on the other side of the centerline 51.

Another aspect of the invention is to provide a high quality coating (>10 GPa hardness, impervious to 15% HCL and hot NaCl) down the length of the long pipe or other workpiece 10. It has been found that even with uniform control of the plasma with multiple anodes using current splitters and even with uniform injection of reactive gas using a gas injector, that some areas of the coating were of poor quality (<10 GPa) with the remainder of high quality. These areas of poor quality coating have multiple causes that are addressed by various embodiments.

The reactive gas that is introduced into the center of the pipe or other workpiece 10 has very low velocity. This low velocity of gas at the center of the pipe is a result of pumping out the gas from the ends of the hollow workpiece 10 in various embodiments, so that the lowest flow rate and thus lowest velocity is in the center of the workpiece 10. As the gas flows from the center toward the ends of the workpiece 10 and more gas is added from the next gas injection holes, the gas velocity continues to increase. This low velocity gas in the center section of the workpiece 10 will more easily become depleted and is also more sensitive to turbulence caused by the introduction of high pressure, high velocity gas from the reactive or process gas injector holes. This situation is resolved in various embodiments by the introduction of a properly distributed plasma moderating gas, which may be hydrogen or an inert gas. The hydrogen or other plasma moderating gas must be distributed down the length of the pipe or other workpiece 10 differently than the reactive gas, so a separate plasma moderating gas injector is used. An example of the hydrogen injector design is shown above with reference to FIG. 9 and dimensions applicable thereto. The plasma moderating gas hole size used in this design is 10 mils for all holes except for the center hole which is 20 mils. It can be seen that hydrogen is preferentially delivered to the center section of the pipe compared to the ends, and this increases the velocity of the gas in the center section. Relative to the rate of production of a PECVD coating, hydrogen behaves as an inert gas and reduces the reaction rate of the process gas in locations where the hydrogen is applied. Both the higher velocity and lower reaction rate will reduce depletion of the reactive gas and prevent gas phase nucleation, resulting in a high quality coating. Hydrogen is chosen in one example over other inert gas as it can diffuse into the coating and is thought to tie up dangling bonds, thus further improving the quality of the coating. Additionally a relatively high partial pressure of hydrogen in the gas phase will tend to suppress the formation of highly reactive double or triple bonded radicals and suppress polymerization reactions, all of which species would result in gas phase nucleation and poor quality coatings.

Figure 11:
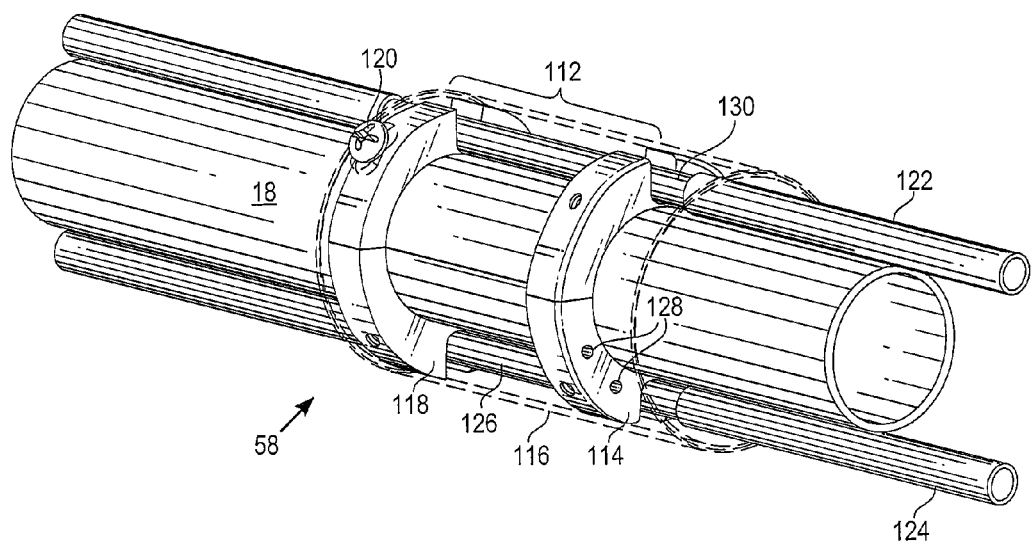
FIG. 11 is a perspective view of a gas chamber diffuser suitable for use in the apparatus of FIG. 9.

Another cause of poor quality coating is caused by high velocity gas jetting out of the small holes in the gas injector. This high velocity gas causes turbulence and disrupts the boundary layer on the pipe surface. A chamber diffuser 58, shown in FIG. 9 and discussed below with reference to FIG. 11, is used in one embodiment to uniformly release lower velocity gas into the interior of the pipe close to the anode and gas delivery assembly 900 or lance, so that the boundary layer near the interior surface 15 of the pipe or other workpiece 10 is not disturbed. A computational flow dynamics (CFD) simulation of the gas velocity exiting from a model of a chamber diffuser has shown that there is little or no disruption of the boundary layer at the interior surface 15 of the pipe where the coating is formed. Another aspect of at least one embodiment is that the diffusers are designed to release gas only in the direction of bulk gas flow (toward the pump out end of the pipe or other workpiece 10 and not toward the center) so that there is no recirculation of gas, which recirculation may cause poor quality coating.

Poor quality coating is also observed to occur near anode locations. It is believed this poor quality coating is caused by the high fields and high energy electrons streaming into the anode slots 50 in the anode and gas delivery assembly 900 or lance, generating many radicals and reactive species and resulting in soft, thick and porous coatings. As described with reference to FIG. 9, this problem can be partially addressed by controlling the size and distribution of the anode access holes 50 in the anode and gas delivery assembly 900 or lance. In one example applicable to the anode and gas delivery assembly 900, the active tip of the actual anode 20 is approximately 1 inch behind the anode slot 50 (i.e. the anode slot is at 19 inches from the center or midpoint of a length of the anode support tube 18 and the anode tip is at 20 inches from this midpoint). If the anode tip is too close to the anode slot 50, electrical arcing takes place, to the detriment of the quality of the plasma and the coating being applied. If the anode tip is too far back from the anode slot 50, the voltage will increase to an excess DC voltage condition and the temperature will drop (e.g. if the two anodes symmetrically located at 21 inches towards each respective end from the center are pulled back to 25 inches, the center temperature will drop and the process voltage will increase). Too high a DC voltage can damage the power supply. Proper placement of the anode tip relative to the respective anode slot balances these two conditions, minimizing arcing and reducing the DC voltage that supports the current driving the plasma. An efficient plasma process is achieved with a greater current and a lesser voltage, the greater current leading to a more rapid deposition of a coating as a result of the larger number of carbon or other deposition product ions. To further resolve the above-described problem, in one embodiment an inert gas, for example hydrogen, is introduced into the gas stream near anodes, which reduces the plasma activity around the anode and results in a high quality coating.

In one example, the reactive or process gas injector carries various lower levels of inert gas mixed with the process gas. In one embodiment silane, acetylene and methylsilane are used as reactive gases to form a silicon doped DLC coating. The silane is diluted with argon in the gas bottle, to reduce fire hazard, to a level of approximately 2% silane and 98% argon.

Further, the inert gas injector may carry various lower levels of reactive or process gas mixed with non-reactive, inert or plasma moderating gas. In one embodiment small flow levels of tetramethylgermanium and/or tetramethylsilane are carried with higher levels of hydrogen through the inert gas injector to form a germanium and/or silicon doped DLC.

Various types of diffusers may be used to introduce various gases. Generally, a diffuser more uniformly releases a gas at a lower velocity as compared to gas released through a hole, a nozzle or a jet from a gas line. Gas may be initially released into a diffuser through a hole, a nozzle or a jet from a gas line, then diffused into an interior region of a workpiece through or by means of the diffuser.

With reference to FIG. 10, a notch diffuser 60 is shown. The notch diffuser 60 is constructed from tubing 67, with a notch 69 cut or otherwise formed in the tubing 67. One or more examples of notch diffuser 60 may be used for diffusing hydrogen or other plasma moderating gas. One or more examples of notch diffuser 60 may be used for diffusing process gas, and/or a chamber diffuser may be used. To use the notch diffuser 60, a gas supply line having a hole, nozzle, jet or other fitting for dispensing a gas is inserted into one end of the notch diffuser 60, until the hole or other fitting is at the specified location. Locating the hole inside of the tubing 67 but not within the notch 69 region results in a more even diffusion of the gas. In FIG. 9, a hydrogen hole is located between two notches 69 in the notch diffuser 60. Gas exits at a high velocity from the holes in the hydrogen line and exits the notch diffuser 60 at the notches 69. As a result of the notches 69 facing towards the anode support tube 18 and away from the internal surfaces 15 of the workpiece 10 where the high quality coating is being formed, the gas is diffused closer to the anode support tube 18 and away from the coating forming region on the workpiece 10.

With reference to FIG. 11, a gas chamber diffuser 58 is shown. The chamber diffuser 58 provides a more even diffusion of a gas than does the notch diffuser 60, and is utilized for diffusing the process gas. The chamber diffuser 58 has a chamber member 112 and a diffuser member 114. In the example shown, the chamber diffuser 58 is constructed of an end ring 118 and a diffuser member 114, both of which clamp around the anode support tube 18 of the lance. An outer tube 116 (shown in dashed lines) fastens to the end ring 118 with a fastener 120. The outer tube 116, the end ring 118, the diffuser member 114 and the anode support tube 18 form the walls of the chamber or the chamber member 112. Gas supply support tubes 122 and 124 may be attached to the anode support tube 18 or to the chamber diffuser 58. Process gas line 126 is routed through the appropriate gas supply support tube 124 and positioned so that a process gas hole (not shown) aligns within the chamber member 112. Gas from the process gas hole is emitted into the chamber of the chamber member 112 and diffuses outwardly from the chamber member 112 through one or more through holes 128 fluidly connecting the chamber member 112 to the interior region of the workpiece. A hydrogen gas supply line 130 is routed through the chamber diffuser 58, but does not have holes emitting hydrogen gas into the chamber member 112, when the chamber diffuser 58 is used solely for diffusing process gas. In the example shown in FIG. 11, the end ring 118 does not have through holes to the chamber member, and blocks gas from diffusing through the end ring 118. Further, in the example, the diffuser member 114 is recessed within the outer tube 116. Variations may be devised.

In one example, the chamber diffuser 58 is implemented as a clamshell that clamps around the anode support tube 18. The process gas line 126 slides through holes in the end ring 118 and the diffuser member 114. Gas exits through small holes in the gas line at high velocity and expands into the diffuser chamber, then exits the larger holes 128 at the bottom of the diffuser member 114 at lower velocity. The chamber diffuser 58 lowers the velocity of the gas and directs the gas in the same direction as the background bulk flow in the interior region of the workpiece 10. In so doing, high velocity gas is kept near the anode support tube 18 and away from the interior surfaces 15 of the workpiece 10.

With reference to FIGS. 9-11 the orientation of the workpiece 10 and the gas diffusers 58 and 60 relative to the workpiece 10 affects the distribution of the plasma and the quality of the resultant coating on the inside of the workpiece 10. Absent the gas diffusers, process gas has been observed gathering in the upper half of the hollow interior of the workpiece 10, possibly due to a buoyancy effect occurring even at low pressures needed for a plasma using the hollow cathode effect. A horizontal orientation of the workpiece 10, or the elongated interior region of the workpiece to which the coating will be applied, is a consideration for evenness of process gas and plasma distribution. Having holes on a lower half of a process gas diffuser, such as the gas chamber diffuser 58, introduces the process gas predominantly in a lower half of the interior region of the workpiece 10, producing a more even distribution of the plasma as compared to introducing the process gas evenly in the upper and lower half of the interior region and allowing the process gas to gather in the upper half. Introducing hydrogen or other plasma moderating gas predominantly in the upper half of the interior region of the workpiece 10 produces a more even distribution of the plasma as compared to not introducing a plasma moderating gas or introducing a plasma moderating gas evenly in the upper and lower halves of the interior region of the workpiece. These conditions are achieved by having a majority or all of a plurality of through holes 128 in the chamber diffuser 58 or other diffuser in the lower half of the diffuser member 114 when a chamber diffuser 58 or other diffuser is used for the process gas, and by having the notch diffuser 60 or other diffuser for the plasma moderating gas positioned on the upper half of the anode support tube 18. Introducing the plasma moderating gas primarily in a mid-length region of the interior region of the workpiece further provides for evenness of process gas and plasma distribution, and can be accomplished with suitable distribution of diffusers for the plasma moderating gas. In a variation, the process gas is introduced into a first region, and the plasma moderating gas is introduced into a second region. The first and second regions are within the interior region of the workpiece and oppose each other relative to the lengthwise axis of the workpiece.

In one example, applicable to FIGS. 9-11, process gas is introduced at the center of the interior of the workpiece 10 through a notch diffuser 60. The notch diffuser 60 is mounted to the bottom of the anode support tube 18 at the center of the anode support tube 18. Further, process gas is introduced at one or more symmetric locations to either side of the center through symmetrically mounted chamber diffusers 58. The chamber diffusers 58 are mounted to the anode support tube 18 at specified distance from the center of the anode support tube. A plasma moderating gas is introduced at one or more symmetric locations to either side of the center through symmetrically mounted notch diffusers 60. The notch diffusers are mounted to the top of the anode support tube 18 at specified distance from the center of the anode support tube. Anodes 20 are mounted in spaced apart arrangement along the interior of the anode support tube 18. Various holes are positioned at specified locations.

Figure 12:
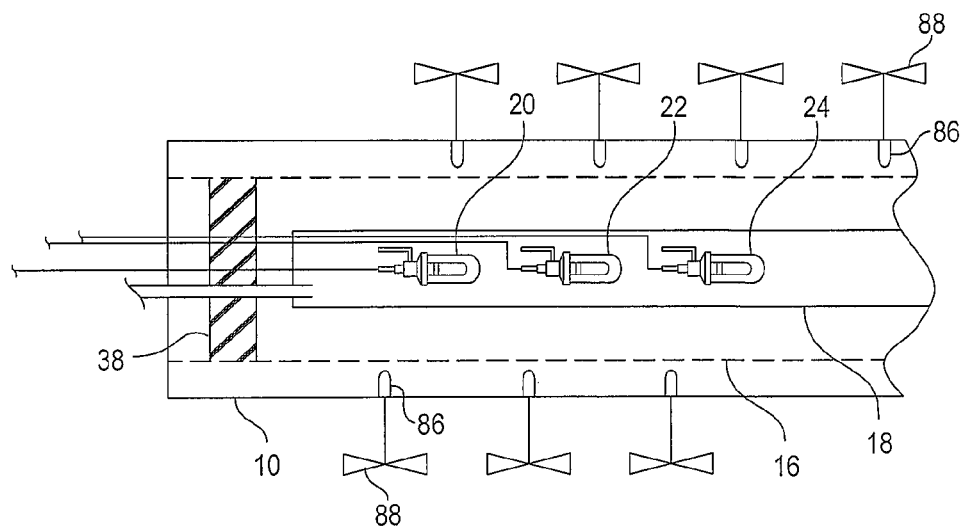
FIG. 12 is a diagram of a zone-based cooling arrangement for promoting plasma uniformity, as a variation of the apparatus of FIG. 1.

With reference to FIG. 12, an apparatus and a method for improved control of plasma uniformity based on workpiece temperature control are described. For many coatings that may be applied to the interior of the workpiece 10, plasma impedance within the active zone may be determined by the temperature at the external surface of the workpiece 10. The temperature of the workpiece 10 increases primarily due to the plasma ion bombardment on the inner surface. Higher plasma intensity produces more ion bombardment and accordingly larger increases in the externally measured temperature of the workpiece 10. Therefore, the plasma intensity profile within the workpiece 10 is similar to its external temperature profile. For example, where the workpiece 10 is a conductive member and the applied coating is DLC, changes in the plasma intensity significantly affect the exterior temperature of the workpiece 10. The inverse is also true. That is, by cooling the exterior surface of the workpiece 10, the plasma intensity is affected, as is the plasma uniformity.

FIG. 12 illustrates an approach to controlling the formation of hot spots, by controlling the axial temperature profile during the coating process. Thermal control of potential hot spots may be provided by monitoring the temperature at the different sections along the workpiece 10 and providing appropriate cooling. For example, where the workpiece 10 is an electrically conductive pipe and the interior of the pipe is being coated with a semiconductor coating, such as DLC, the temperature of individual sections can be easily monitored and controlled along the exterior of the pipe because such a coating becomes more conductive as its temperature increases. For example, a temperature sensor 86 and a cooling device, such as a fan 88, may be located at each section of 0.3 meters. Since plasma impedance is indicated by the temperature at the section, temperature control promotes coating uniformity. Optionally, by merely ensuring cooling at the ends of the pipe, the impedance of the coating at the ends will increase, forcing current and plasma to the center of the pipe.

As described above, each segment of the workpiece 10 may be associated with a different anode 20, 22, and 24. Along the workpiece is positioned a linear array of temperature sensors 86 and fans 88. In FIG. 12, each segment is associated with a temperature sensor 86 and a fan 88. If the temperature detected by one sensor 86 is significantly greater than that of the other sensors 86, the associated fan 88 may be used to control the plasma intensity at the hot spot. While FIG. 12 shows temperature control in segments that coincide with the segments defined by the anodes 20, 22 and 24, this is not a requirement. For example, there may be three temperature sensors 86 for each one-meter segment defined by the positioning of the anodes 20, 22 and 24. In one example, the temperature sensors 86 are non-contact devices, such as IR devices, having outputs which are used to control operation of the associated fan 88.

Further, the temperature can be measured by an IR temperature measuring device moving along a track parallel to the workpiece. Using the above-described temperature measurement or another technique readily devised, such temperature measurement device or devices send output to a control unit e.g. a programmed computer control unit which controls the operation of a fan 88 or group of fans. If the temperature detected by any sensor 86, or at any location, is greater than its setpoint, then a fan 88 or group of fans is activated as determined by the temperature control algorithm in the computer programming. The temperature sensors are positioned uniformly along one side of the workpiece 10, or in another distribution, in sufficient number to accurately reflect the temperature profile of the workpiece 10. In one example, the temperature sensors 86 are positioned in the horizontal plane along one side of the workpiece 10. The fans 88 may be positioned below the workpiece 10. The vertical positioning of the fans 88 is determined primarily by the volumetric output of the fan 88, the fan diameter, and thermal radiation from the workpiece 10. During the process set-up step, the non-cooled heating rate profile of the workpiece 10 is observed with the fixed array of temperature sensors 86 or using a handheld IR temperature measuring device. The axial position and quantity of fans 88 are determined from this initial profile and adjusted so that the temperature profile of the workpiece 10 can be reliably controlled. Thus, zone-temperature control is enabled.

Still further variations and improvements to plasma enhanced chemical vapor deposition systems and methods are herein presented. These variations may make use of portions or entireties of the systems, methods and apparatuses of FIGS. 1-13.

Referring back to FIG. 2, while the workpiece 10 and the anode support tube 18 are shown as being connected to have the same voltage, there may be benefits to providing differing cathode voltages to the workpiece 10 and the anode support tube 18. The bias to the anode support tube 18 may be controlled using a separate power supply or using resistors between the inner and outer cathodes. Another possibility is to provide a differential mode transformer to establish the cathode biases on the anode support tube 18 and the workpiece 10. The bias to the anode support tube 18 may be tailored to increase the deposition rate while minimizing the power requirements, heating, and gas flow requirements.

The pressure (P) within the space between the workpiece 10 and the internal tube 18 may also be tailored. The pressure may be set to optimize the hollow cathode scaling with P*d remaining constant, where d is the distance between the workpiece 10 and the anode support tube 18. This tailoring creates a stronger hollow cathode, since there is no electrically floating component blocking the hollow cathode effect electrons which provide the ionization-enhancing collisions.

In one embodiment, a single internal central anode 20 is used. In comparison to an approach using multiple small separately-controlled anodes 20, this approach has the advantages of reduced arcing due to the large anode surface area, smaller cross-section resulting in less pressure drop, and simplicity of fabrication. A conductive rod or tube is inserted down the center of the workpiece 10 and biased as a central anode. The plasma impedance or uniformity down the length of the workpiece has limited control by current splitters, since there is only one internal anode (compared to the case of multiple-internal anodes), although there is some degree of control with respect to the relative amount of current delivered to the external anodes and the single internal anode. In this case, plasma uniformity is also controlled by covering portions of the central anode tube with electrical insulators, such as ceramic or glass. This results in cooling of the plasma in these areas. Plasma impedance or uniformity down the length can be adjusted by using a non-uniform spacing of these covered areas down the length of the internal anode. Inert and reactive gas can be delivered to the workpiece through tubes that run down the interior of the rod. Holes are placed in the gas tubes and in the outer anode to deliver the gas where needed. In one embodiment, separate chambers are formed within the anode tube using spacers, with non-reactive gas (e.g. argon) delivered to some chamber(s) and reactive gas delivered to other chamber(s). The relative flow of inert gas (e.g. argon) compared to reactive gas flow and the locations where these gases are delivered can also be used to control plasma impedance. In the case of bipolar pulsing, where a small negative voltage is applied to the anode to dissipate positive charge build-up on the semi-insulating coating, one of the internal tubes inside the anode is a conductor and diodes are used to direct the negative anode pulse to the internal tube, with this chamber of the anode tube being purged with inert gas. The positive anode pulse is delivered to the outside anode tube. Since a negative bias is required to make a hard, adherent DLC, this prevents the working anode (the positive pulse external tube) from being coated with DLC. In another embodiment, RF bias can be applied to one of the conductive tubes within the anode tube. Additionally or alternatively, cooling water can be feed through the tube.

The uniformity of the plasma impedance down the length of the work piece is controlled by (1) the relative current split between the central anode and external anodes located at each end and (2) the central anode-to-cathode impedance.

Current provided only to the external anodes at both ends of the workpiece 10 produces a plasma intensity (and temperature) profile greatest at the ends, but decaying to non-useful levels at a distance of about 8 to 12 workpiece diameters away from the ends of the workpiece 10. Conversely, current provided only to the internal anode produces a plasma intensity profile greatest at the center and decaying to non-useful levels at a distance of about 8 to 12 workpiece diameters from both ends. Splitting the current between the external end anodes and the central anode produces an axial plasma intensity profile that is a combination of the two extreme profiles described above. In this case, the plasma intensity profile looks like a "W" with the intensity at the ends being greater or less than the center depending on the relative distribution of the current. Thus, tailoring of the profile to accommodate a particular application is possible.

The central anode-to-cathode impedance is controlled by the anode availability, the characteristics of the plasma, and the coating resistance. The anode availability at any location along the central anode can be reduced by covering it with an electrical insulator, such as ceramic or glass. The plasma impedance is influenced by many factors including temperature, pressure, composition and electron density. The coating resistance is a function of temperature and typically increases with added thickness. For many coatings, including DLC, the resistance decreases with increases in temperature.

An axially uniform plasma and temperature profile is desirable, since it produces a uniform coating. The relative distribution of current between the central anodes and the external end anodes depends on the aspect ratio of the workpiece and where more or less coating is desired during the coating process. The distributed current "W" profile is made uniform as follows: (1) The middle hot spot (center of the "W") is reduced by decreasing the available area of the central anode at the center. The area is reduced by covering it with an electrical insulator, such as ceramic or glass. This will result in decreasing the plasma intensity at the center. If desired, other areas can be covered for the same effect. (2) The regions of lower plasma intensity (bottom points of the "W") are increased by adding external thermal insulation around the exterior of the workpiece. This reduces the rate of heat loss relative to other positions along on the work piece. (3) During operation, temperature control by continuous removal of heat is provided via forced-convection zone cooling along the length of the workpiece. Controlling the axial temperature profile adjusts the internal coating resistance, resulting in a uniform plasma intensity profile. The system of forced-convection zone cooling is described below.

For aspect ratios of 40 or less, it is sufficient for the central anode to be a small fluid-cooled tube under tension. For longer aspect ratios, the central anode is a larger diameter outer tube where inert and reactive gas can be delivered to the workpiece through smaller tubes that run down the interior of the central anode. Holes are placed along one of the smaller gas tubes and correspondingly in the larger outer anode tube to deliver the gas where needed. In one embodiment, separate chambers are formed within the outer anode tube using spacers, with non-reactive gas (e.g. argon) delivered to some chamber(s) and reactive gas delivered to other chamber(s). The relative flow of inert gas (i.e., argon) compared to reactive flow and the locations where these gases are delivered can also be used to control plasma impedance.

In the case of bipolar pulsing, a small negative voltage is applied to the anode to dissipate positive charge build-up on the semi-insulating coating. Without this charge dissipation, the rate of coating growth decreases and arcing can occur. This small negative voltage on the anode makes it act briefly as a "reverse cathode". The negative bias promotes hard, adherent and insulating DLC to form on the anode, causing the anode it to lose effectiveness. The use of gas-purged external anodes mitigates this concern at the workpiece ends.

One option to protect the central anode tube from the negative bias during the reverse pulse is to block this pulse with a diode. Only the positive anode pulse is delivered to the central anode tube. This will result in "non-energetic" coating deposition on the central anode. This type of deposition is electrically conductive at the elevated process temperature. Towards the end of the coating process, where charge dissipation is more important, the diode is removed allowing the "forward anode" to also act as the "reverse cathode". Since there is a conductive sub-coating on the anode before this point, the DLC deposition formed after this point will be of poor quality and still mostly conductive. After a period of time, it will become non-conductive. Sufficient charge dissipation occurs, allowing the coating process to continue until that point in time is reached. This point in time is characterized by an increase in the voltage required to maintain the same current and arcing.

Another option is to allow the internal tube(s) inside the outer central anode tube to also serve as a conductor. Only the positive anode pulse is delivered to the outer central anode tube, the reverse pulse being blocked by diodes. Other diodes are used to direct the reverse pulse to specific locations along the internal tube(s) which serve as a "reverse cathode". At these specific locations are chambers purged with inert gas.

In another embodiment, a small amount of RF energy can be applied along the outer central tube or along the interior conductive tubes with different configurations of feed and return possible. The RF energy can have beneficial effects by keeping plasma present even during off periods in pulsed DC operation. This can prevent high strike voltages during pulse DC operation.

Additionally, cooling or heating fluid (e.g., water, steam, oil) can be feed through an interior tube for temperature control and to facilitate evaporation of liquid precursors.

The central anode tube is centrally positioned in the workpiece by placing it under tension. Additionally, the central anode tube can be pre-stressed with a shape that when placed horizontally causes it to straighten under the influence of gravitational force.

Additionally, to increase the stability of the horizontal alignment, the central tube under tension may have a slight applied torque at each end. The applied torque to the ends can be either clockwise or counter-clockwise but must be opposed (i.e., the same when viewed from each end).

Figure 13:
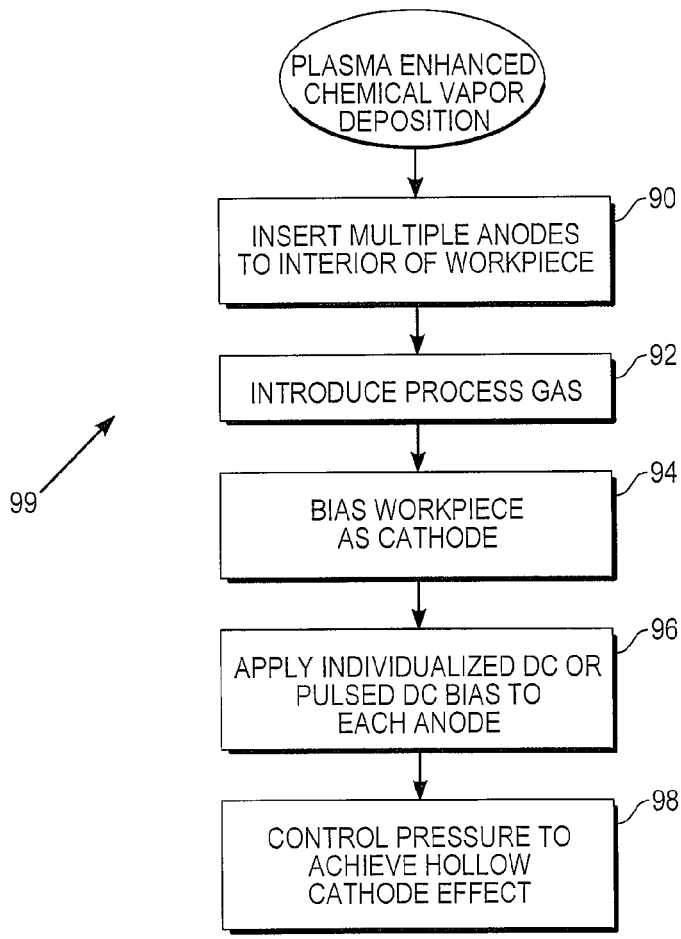
FIG. 13 is a flow diagram of a method for plasma enhanced chemical vapor deposition to an interior region of a workpiece, which may be applied using the apparatus of FIG. 1, FIG. 9, FIG. 12 or another variation.

With respect to FIG. 13, a method 99 is described for plasma enhanced chemical vapor deposition of a coating to an elongated interior region of a workpiece, such as a tube or a pipe or other hollow workpiece. The method 99 may be applied using the multiple anode apparatus of FIG. 1, 9 or 12 or another variation as described or devised by a person skilled in the art based upon the teachings herein disclosed. The method 99 is applicable to a workpiece with an aspect ratio greater than or equal to 5:1 and to a workpiece with an aspect ratio greater than or equal to 20:1, including workpieces with an aspect ratio of equal to 20:1, 30:1, 64:1, 100:1 and 120:1. The method 99 is applicable to and scalable to aspect ratios of 150:1 or higher.

A tube, pipe or other hollow workpiece is prepared for plasma enhanced chemical vapor deposition of a coating to an elongated interior region of the workpiece. Such preparation may include inspecting, cleaning, installation of vacuum and pressure fittings, bracing the workpiece, attaching the workpiece to an apparatus, orienting the workpiece (e.g. horizontally) and so on.

Multiple anodes are inserted 90 into the interior region of the workpiece. The anodes are in spaced apart arrangement along the elongated interior region of the workpiece. The anodes may be inserted and/or arranged within the interior region of the workpiece at specified spacings or locations and using an anode support tube such as described above.

A process gas is introduced 92 into the interior region of the workpiece. The process gas may be introduced via a process gas line and via one or more diffusers such as described above.

A respective individualized DC or pulsed DC bias is applied 96 to each of the anodes. The bias excites the process gas into a plasma. The workpiece is biased 94 as a cathode. Various circuits including current splitters, differential mode transformers, switches and connections such as described above may be used in biasing the anodes and the cathode.

The pressure in the interior region of the workpiece is controlled 98 to achieve a hollow cathode effect in the plasma. Various techniques such as described above may be used in controlling the pressure and in achieving a hollow cathode effect in the plasma.

Various techniques, systems, subsystems and devices as described above may be applied in order to control the plasma impedance, plasma distribution, plasma uniformity and aspects of the resultant PECVD coating produced on the interior of the workpiece.

Figure 14:
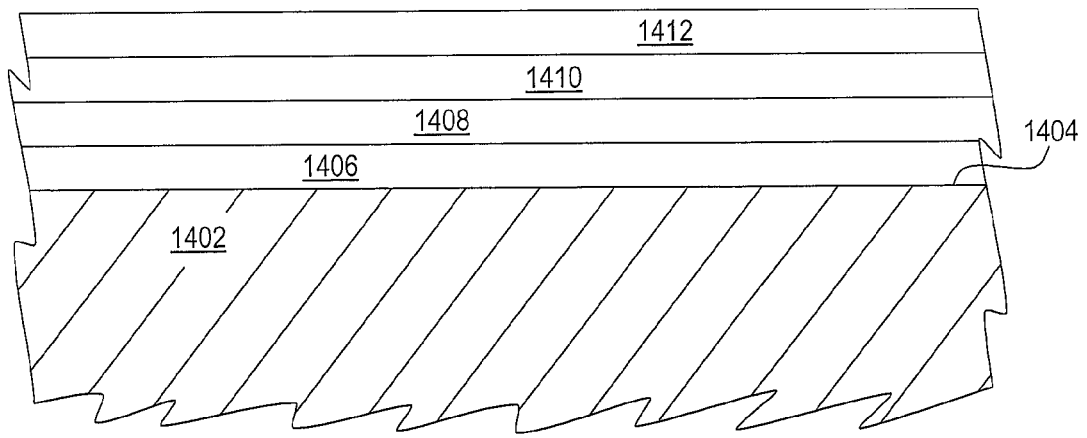
FIG. 14 is a cross-section view of layers deposited to a workpiece, using the method of FIG. 13.

With reference to FIG. 14, an embodiment of the method and the apparatus is used to produce articles including pipes with layered diamond-like coatings deposited onto the internal surfaces 1404 of the pipes 1402. The pipes are 10 feet long and have 3 inch diameters, for an aspect ratio of 40. The built-up coating on these pipes has four layers, each of which is applied as a coating. A first layer 1406 includes a thin silicon adhesion layer applied to the claimed internal surface 1404 of the pipe 1402. A second layer 1408 includes a blended silicon and germanium adhesion layer applied to the first layer. A third layer 1410 includes a silicon and germanium doped diamond-like coating layer with an increasing carbon content through the layer, applied to the second layer. A fourth layer 1412 includes a diamond-like "cap" layer applied to the third layer. Measurements show a coating thickness of approximately 22 microns, a hardness of approximately 11-14 GPa and a coefficient of friction of 0.02-0.09.

In one example, a multilayer coating is produced on interior surfaces of an elongated hollow workpiece made of steel, using an embodiment of the method and the apparatus. In order to adhere a diamond-like coating, an adhesive layer is applied to the cleaned steel interior surface of the workpiece. The adhesive layer is relatively pure silicon. The high ion bombardment creates a mixing of steel and silicon, such that of an approximately 1000 angstroms thick layer, approximately 10% or 20% is a mixed layer of silicon bonded with steel. After the adhesive layer, a blend layer is applied. As the blend layer is applied, the silicon content is slowly reduced by lowering the silane from 100% to 0%, and the carbon content is slowly increased by raising the acetylene from 0% to 100%. This blend layer compensates for a mismatch in properties between pure silicon layers and pure carbon layers, and prevents delamination. After the blend layer, as a topmost layer, a pure carbon diamond-like coating layer is applied as a "cap" layer.

A product is produced as an apparatus, using a disclosed method and a disclosed apparatus. A hollow tubular substrate of high aspect ratio greater than or equal to about thirty to one has a diamond-like or doped diamond-like layer. The layer has a substantially uniform thickness greater than about twenty microns, and a substantially uniform hardness greater than about nine giga pascals. In a first variation, the diamond-like or doped diamond-like coating layer has a silicon or germanium dopant.

In a second variation, the hollow tubular substrate has a steel interior surface, to which an adhesion layer is bonded. The adhesion layer is between the substrate and the diamond-like or doped diamond-like coating layer. The adhesion layer includes a mixed layer of silicon bonded with steel. The adhesion layer is bonded by the mixed layer to the steel interior surface of the hollow tubular substrate.

In a third variation, a blend layer is deposited between the adhesion layer and the diamond-like or doped diamond-like coating layer. The blend layer has a silicon content decreasing from greater than about 90% at the adhesion layer to less than about 10% at the diamond-like or doped diamond-like coating layer. The blend layer has a carbon content increasing from less than about 10% at the adhesion layer to greater than about 90% at the diamond-like or doped diamond-like coating layer.

In a fourth variation, the diamond-like or doped diamond-like coating layer has a coefficient of friction of approximately 0.02 to 0.09.

In further examples, a pure silicon adhesion layer is applied, followed by a diamond-like coating with a low percentage of silicon i.e. a low silicon to carbon ratio. The low silicon to carbon ratio may be less than or approximately 1%. Further variations may be devised, with or without a cap layer.

What is claimed is:

1. A method for plasma enhanced chemical vapor deposition (CVD) to an interior surface of a hollow tubular high aspect ratio workpiece, the method comprising simultaneously coating the entire interior surface as a single section by:
providing at least three anodes in axially spaced apart arrangement along an entire lengthwise axis of an elongated interior of a hollow tubular workpiece of high aspect ratio greater than or equal to about thirty to one;
providing an elongated support tube dimensioned to reside in the elongated interior of the workpiece along its entire length and arranging the anodes in spaced apart relation inside of the elongated support tube, wherein a ratio of a spacing between anodes to an interior diameter of the hollow tubular workpiece is between about twenty to one and about one to one;
the workpiece being biased as a cathode and the elongated support tube is allowed to float electrically or be biased as a cathode so to form a plasma region in the interior of the workpiece between the support tube and workpiece, the support tube having a set of holes therein on all sides situated in proximity to the anodes within the support tube so as to allow electron flow between anodes and the plasma region;
introducing a CVD process gas into the entire plasma region in the interior of the workpiece;
applying a respective individualized DC or pulsed DC bias to each of the plurality of anodes to excite the process gas into a plasma; and
controlling a pressure of the process gas in the interior of the workpiece to maintain a plasma.

2. The method of claim 1 wherein maintaining a plasma includes maintaining a hollow cathode effect in the plasma.

3. The method of claim 1 wherein introducing a process gas into the interior region of the workpiece includes routing the process gas through one or more gas diffusers.

4. The method of claim 1 wherein the interior region of the workpiece is oriented horizontally and the process gas is introduced predominantly in a lower half of the interior region of the workpiece.

5. The method of claim 1 further comprising introducing an anode gas in a vicinity of at least one of the plurality of anodes.

6. The method of claim 1 further comprising introducing a plasma moderating gas into the interior region of the workpiece.

7. The method of claim 6 wherein the process gas is introduced into a first region and the plasma moderating gas is introduced into a second region, the first and second regions being within the interior region of the workpiece and opposing each other relative to the lengthwise axis.

8. The method of claim 6 wherein the plasma moderating gas is introduced predominantly in a mid-length region of the interior region of the workpiece.

9. The method of claim 1 wherein the CVD process gas includes constituents of a diamond-like coating or a doped diamond-like coating.

10. The method of claim 1 wherein the CVD process gas includes constituents of a diamond-like coating having a dopant that includes silicon or germanium.

11. The method of claim 1 further comprising electrically supplying a current and splitting the supplied current at a respective selected proportion to each of the plurality of anodes.

12. The method of claim 1, wherein a differential mode is used in establishing current to each of said anodes.

13. The method of claim 1, wherein during said method steps to maintain a plasma, also controlling axial temperature profile along said high aspect ratio workpiece.

14. A method for plasma enhanced chemical vapor deposition (CVD) to an interior region of a hollow tubular high aspect ratio workpiece, wherein the interior region of the workpiece is oriented horizontally, the method comprising coating the interior region as a single section by:
providing at least three anodes in axially spaced apart arrangement along an entire lengthwise axis of an elongated interior region of a hollow tubular workpiece of high aspect ratio greater than or equal to about thirty to one;
introducing a CVD process gas into the interior region of the workpiece;
introducing a plasma moderating gas into the interior region of the workpiece, the plasma moderating gas being introduced predominantly in an upper half of the interior region of the workpiece;
applying a respective individualized DC or pulsed DC bias to each of the plurality of anodes to excite the process gas into a plasma; and
controlling a pressure of the process gas in the interior region of the workpiece to maintain a plasma.

* * * * *